US010446747B1

(12) United States Patent
Derhacobian et al.

(10) Patent No.: US 10,446,747 B1
(45) Date of Patent: Oct. 15, 2019

(54) METHODS OF OPERATING INTEGRATED CIRCUIT DEVICES HAVING VOLATILE AND NONVOLATILE MEMORY PORTIONS

(71) Applicant: Adesto Technologies Corporation, Santa Clara, CA (US)

(72) Inventors: Narbeh Derhacobian, Belmont, CA (US); Shane Charles Hollmer, Grass Valley, CA (US)

(73) Assignee: Adesto Technology Corporation, Santa Clara, CA (US)

( * ) Notice: Subject to any disclaimer, the term of this patent is extended or adjusted under 35 U.S.C. 154(b) by 0 days.

(21) Appl. No.: 15/693,360

(22) Filed: Aug. 31, 2017

Related U.S. Application Data

(62) Division of application No. 15/155,301, filed on May 16, 2016, now Pat. No. 9,755,142, which is a division of application No. 14/231,729, filed on Mar. 31, 2014, now Pat. No. 9,343,667, which is a division of application No. 13/157,713, filed on Jun. 10, 2011, now Pat. No. 8,687,403.

(60) Provisional application No. 61/353,415, filed on Jun. 10, 2010.

(51) Int. Cl.
*G11C 11/00* (2006.01)
*H01L 45/00* (2006.01)
*G11C 14/00* (2006.01)

(52) U.S. Cl.
CPC .......... *H01L 45/085* (2013.01); *G11C 14/009* (2013.01); *G11C 14/0045* (2013.01)

(58) Field of Classification Search
CPC ..................................................... G11C 11/00
USPC ........... 365/46, 94, 100, 129, 148, 158, 163; 257/2–5, 9, 310, E21.35; 438/95, 96, 438/135, 166, 240, 365, 482, 486, 597, 438/785
See application file for complete search history.

(56) References Cited

U.S. PATENT DOCUMENTS

| | | | |
|---|---|---|---|
| 6,924,663 B2 * | 8/2005 | Masui et al. | 326/38 |
| 7,190,190 B1 * | 3/2007 | Camarota et al. | 326/38 |
| 7,336,525 B2 * | 2/2008 | Fujita et al. | 365/154 |
| 7,688,634 B2 | 3/2010 | Richter et al. | |
| 8,107,273 B1 | 1/2012 | Hollmer et al. | |
| 8,294,488 B1 | 10/2012 | Derhacobian et al. | |
| 8,331,128 B1 * | 12/2012 | Derhacobian et al. | 365/148 |
| 8,687,403 B1 | 4/2014 | Derhacobian et al. | |
| 9,343,667 B1 | 5/2016 | Naveh | |
| 9,755,142 B1 | 9/2017 | Naveh | |
| 2003/0122578 A1 * | 7/2003 | Masui et al. | 326/39 |
| 2006/0083047 A1 * | 4/2006 | Fujita et al. | 365/145 |
| 2007/0140023 A1 * | 6/2007 | Helfer et al. | 365/200 |
| 2008/0080226 A1 | 4/2008 | Mikolajick et al. | |

* cited by examiner

*Primary Examiner* — Harry W Byrne

(57) ABSTRACT

A method can include, by operation of a controller circuit, writing data into a volatile memory portion formed in an integrated circuit substrate of a memory device. In response to first conditions, date can be written from the volatile memory portion into a nonvolatile memory portion formed in the same integrated circuit substrate as the volatile memory portion. The nonvolatile memory portion can store the data in two terminal memory elements re-programmable between at least two different resistance states.

20 Claims, 27 Drawing Sheets

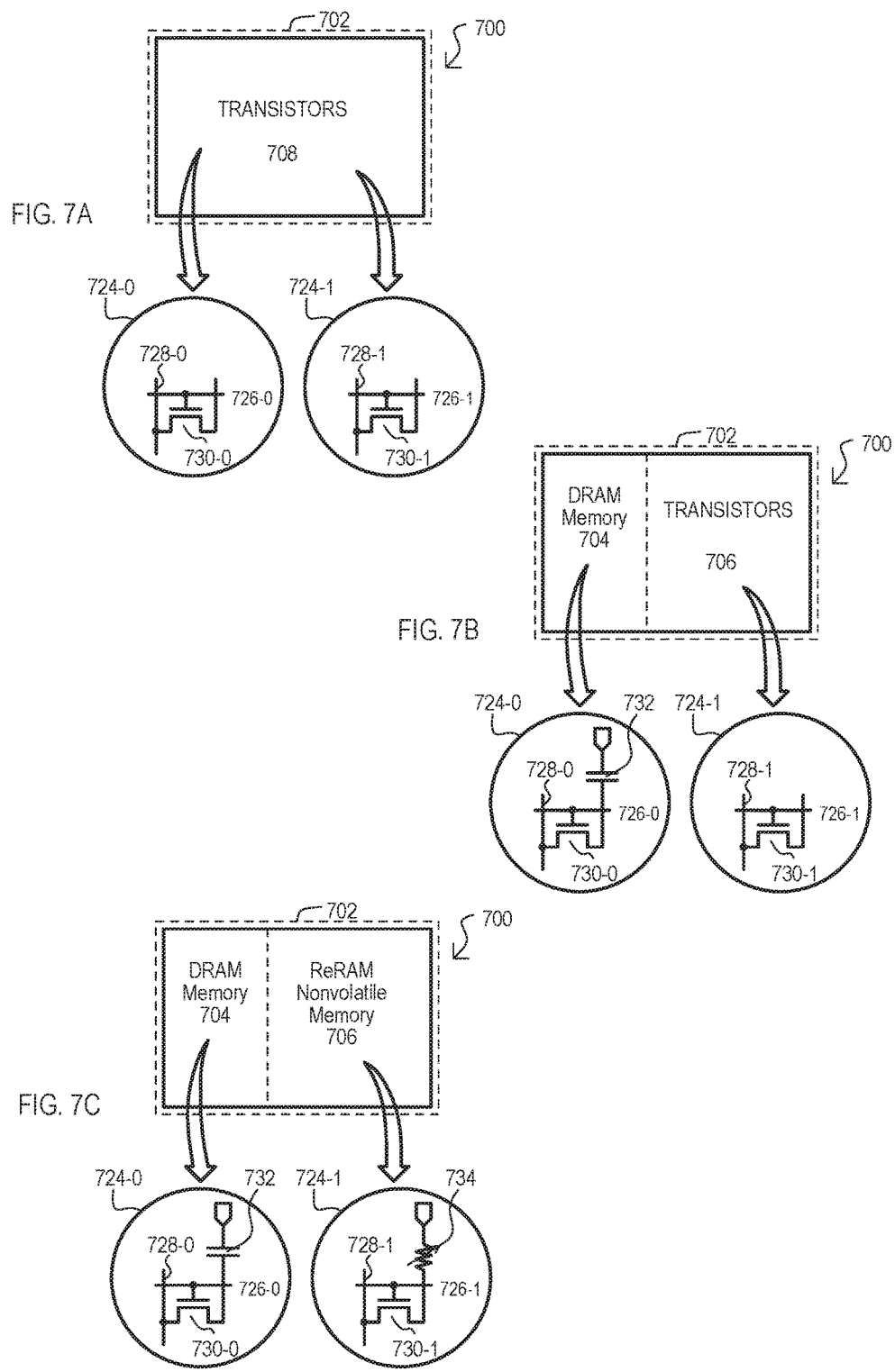

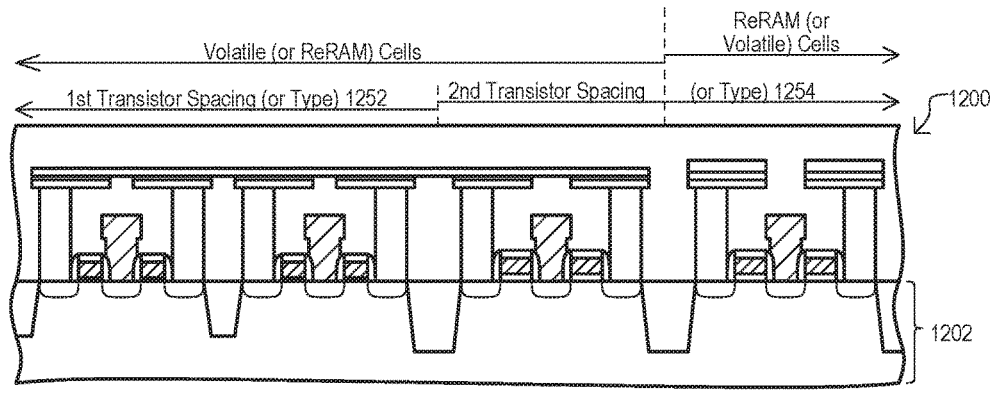
FIG. 12
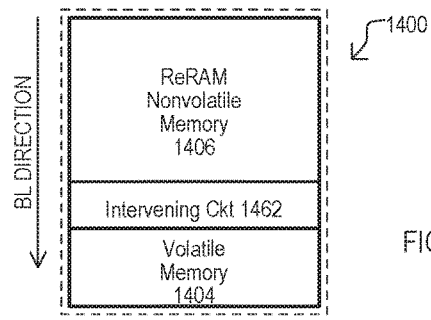
FIG. 14
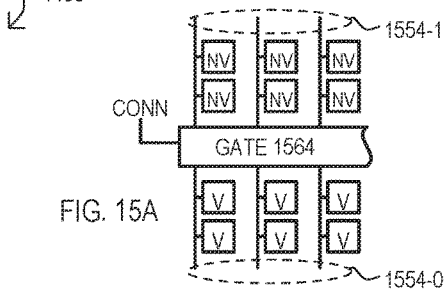
FIG. 15A
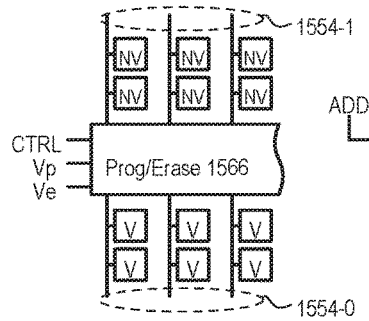
FIG. 15B
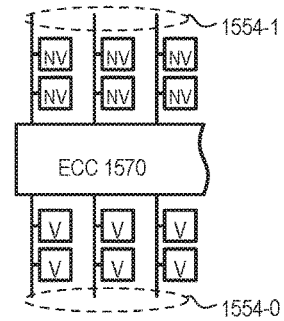
FIG. 15D
FIG. 15C
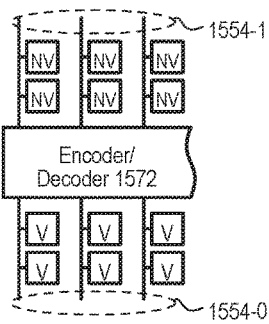
FIG. 15E

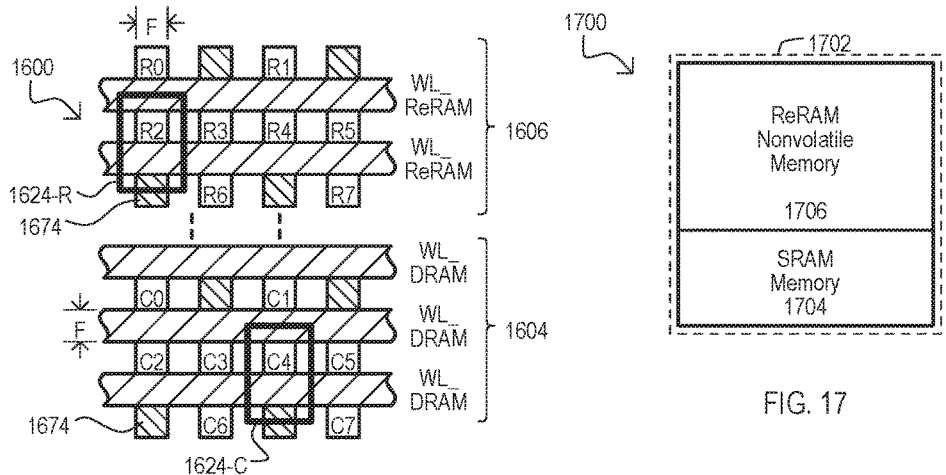
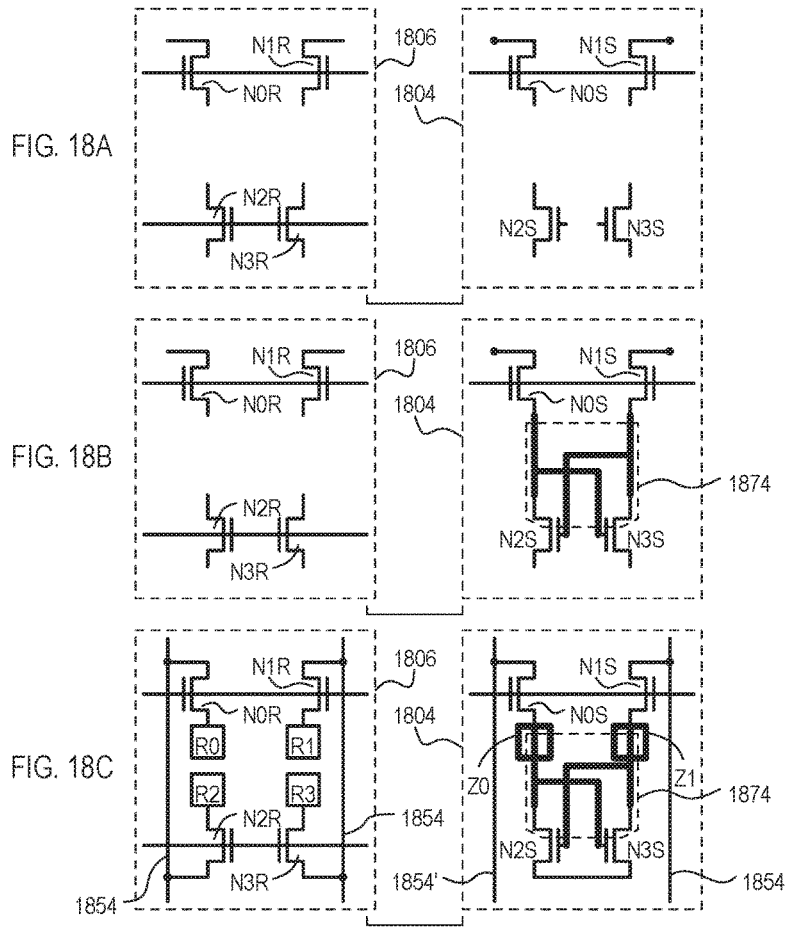
FIG. 16
FIG. 17
FIG. 18A
FIG. 18B
FIG. 18C

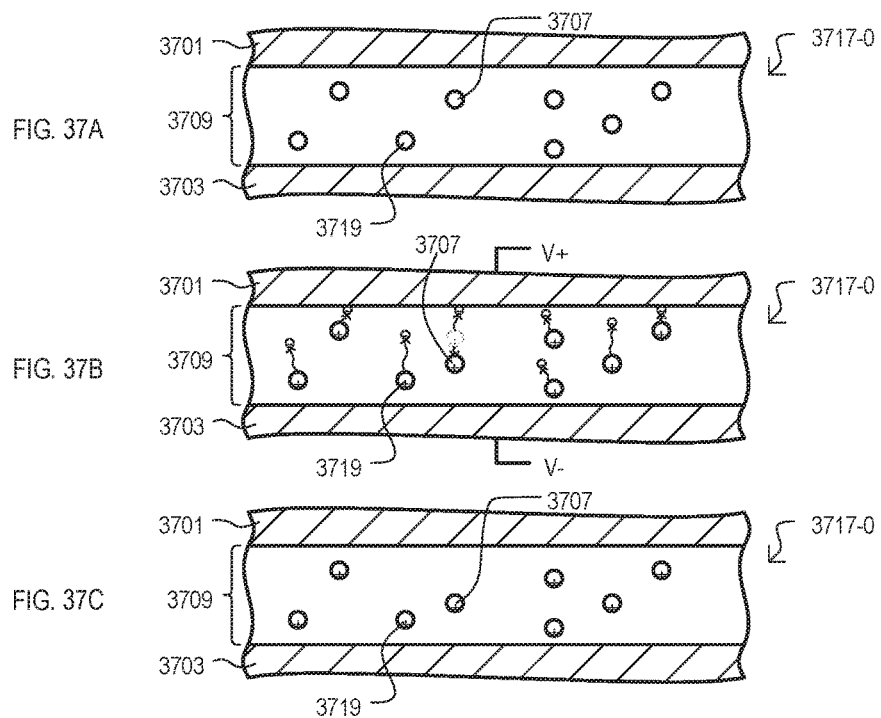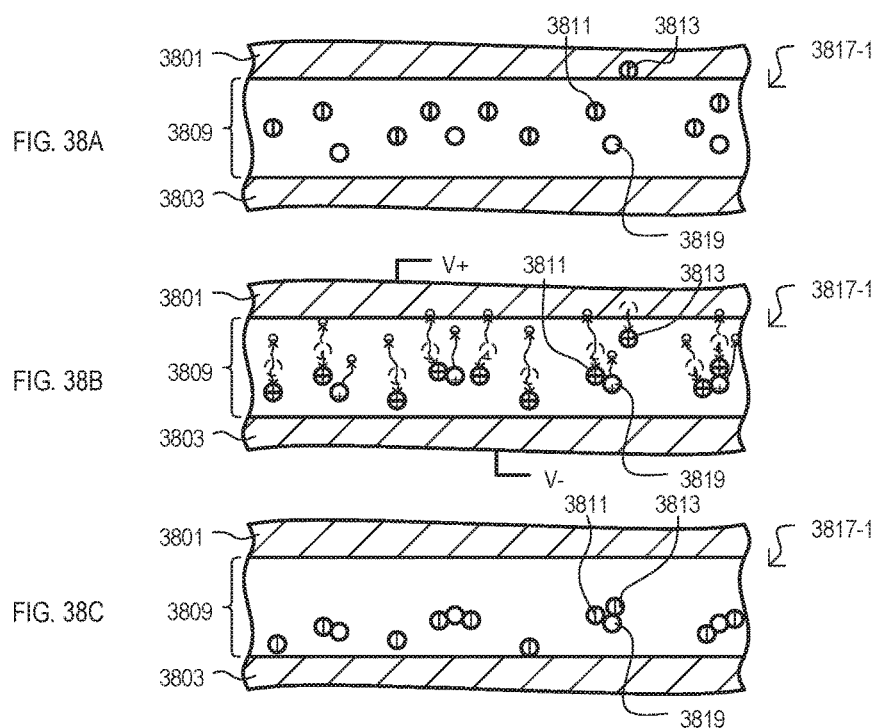

FIG. 41
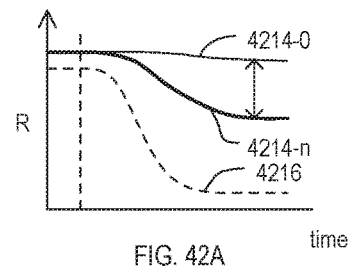
FIG. 42A
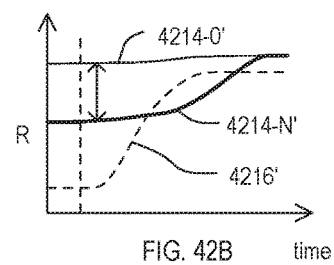
FIG. 42B
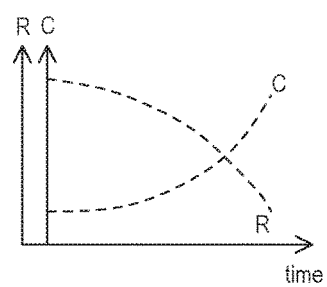
FIG. 42C
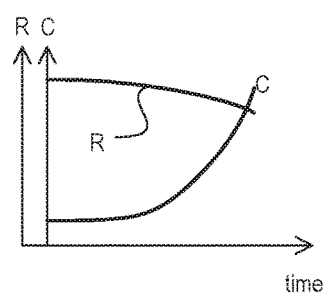
FIG. 42D

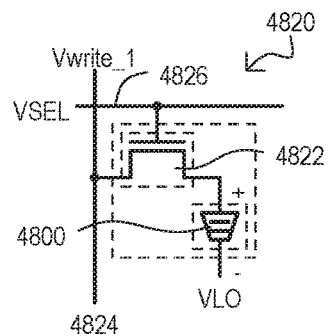 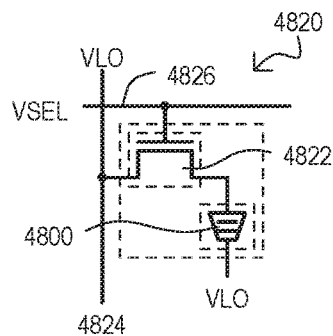
FIG. 48A    FIG. 48B
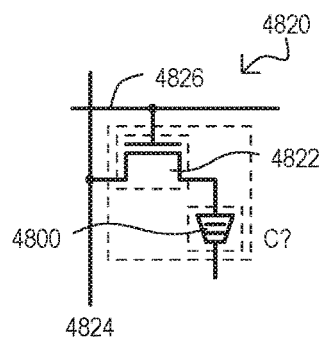 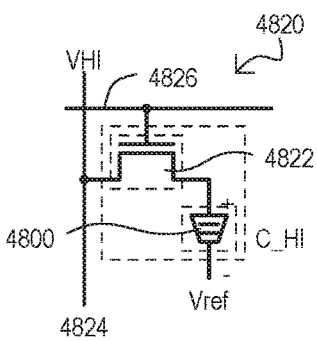 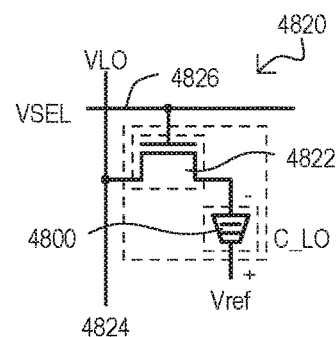
FIG. 48C    FIG. 48D    FIG. 48E
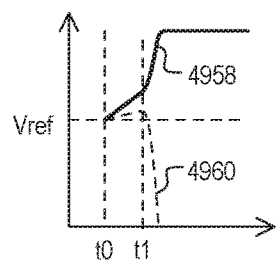 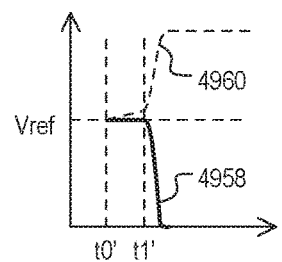
FIG. 49A    FIG. 49B

METHODS OF OPERATING INTEGRATED CIRCUIT DEVICES HAVING VOLATILE AND NONVOLATILE MEMORY PORTIONS

This application is a divisional of U.S. patent application Ser. No. 15/155,301, filed on May 16, 2016, which is a divisional of U.S. patent application Ser. No. 14/231,729, filed on Mar. 31, 2014, now U.S. Pat. No. 9,343,667, issued on May 17, 2016, which is a divisional of U.S. patent application Ser. No. 13/157,713 filed on Jun. 10, 2011, now U.S. Pat. No. 8,687,403, issued on Apr. 1, 2014, which claims the benefit of U.S. Provisional Patent Application Ser. No. 61/353,415 filed on Jun. 10, 2010, the contents all of which are incorporated by reference herein.

TECHNICAL FIELD

The present disclosure relates generally to integrated circuits, and more particularly to integrated circuits having volatile memory sections and nonvolatile memory sections, including nonvolatile memory sections with two-terminal programmable resistance elements.

BRIEF DESCRIPTION OF THE DRAWINGS

FIGS. 7A to 7C are a top plan views showing a method of making a memory device with a DRAM portion and a ReRAM portion according to another embodiment.

FIG. 12 is a side cross sectional view showing a memory device in which a volatile or resistive non-volatile portion may include transistors with different spacings or sizes according to another embodiment.

FIG. 14 is a top plan view showing memory device having intervening circuits between a volatile portion and a resistive non-volatile portion according to an embodiment.

FIGS. 15A to 15E are block schematic diagrams showing intervening circuits that can be included in an embodiment like that of FIG. 14.

FIG. 16 is a top plan view of a memory device having volatile and resistive non-volatile memory sections with memory cells having an area of $6F^2$, where F is a minimum feature size.

FIG. 17 shows a top plan view of a memory device according to an embodiment having a static RAM (SRAM) portion and a ReRAM portion according to an embodiment.

FIGS. 18A to 18C show a method of forming a memory device like that of FIG. 17 according to one embodiment.

FIGS. 37A to 37C are side cross sectional views showing a programmable impedance structure and operation having substantially non-mobile oxidizable elements according to an embodiment.

FIGS. 38A to 38C are side cross sectional views showing a programmable impedance structure and operation having substantially non-mobile and mobile oxidizable elements according to an embodiment.

FIG. 41 is a side cross sectional views showing a programmable impedance structure having substantially non-mobile species according to an embodiment.

FIGS. 42A to 42D are graphs comparing a response of embodiments having programmable impedance structure with substantially non-mobile species as compared to conventional elements.

FIGS. 48A to 48E are sequences of schematic diagrams showing the writing of data values to memory cells according to embodiments.

FIGS. 49A and 49B are graphs showing data sensing operations that can be included in embodiments.

DETAILED DESCRIPTION

Various embodiments disclosed herein show circuits and methods directed to devices having programmable impedance elements. Such circuits and methods may include memory devices in which data may be transferred between volatile and substantially nonvolatile memory cells formed with programmable impedance elements, memory devices with programmable impedance elements and bipolar junction transistor access devices, and/or memory elements where such programmable impedance elements include a solid electrolyte dielectric.

In the figures below, it is understood that responses shown in graphs are illustrative and can vary according to implementation.

Figure 1:
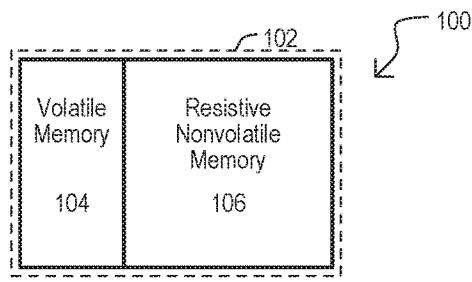
FIG. 1 is a top plan view of a memory device according to an embodiment having a volatile memory portion and non-volatile memory portion formed with resistive memory elements.

FIG. 1 shows a memory device 100 according to one embodiment. Memory device 100 can be formed in a common integrated circuit substrate 102. Substrate 102 may be divided into two or more portions, including one or more volatile memory portions (one shown as 104) and one or more non-volatile resistive memory portions (one shown as 106).

A substrate 102 may be single integrated circuit (IC) die. A memory device 100 may be a standalone memory IC, or may be an "embedded" memory forming one portion of a larger IC device. In some embodiments, such an IC may be silicon based.

A volatile memory portion 104 may include volatile memory cells that can eventually lose stored data in the absence of power, including but not limited to dynamic random access memory (DRAM) cells, including "pseudo-static RAM" (i.e., one-transistor "1-T" SRAM) cells as well as conventional static RAM (SRAM) cells. Conventional SRAM cells may include, but not be limited to, four transistor (4-T), six transistor (6-T), and eight transistor (8-T) SRAM cells. In one embodiment, a volatile memory portion 104 may be a resistive memory portion programmable for a relatively short data retention time.

A non-volatile memory portion 106 may include resistive memory cells that store data values based on a resistance. Such a resistance can be programmed between two or more different resistance values multiple times. Such a resistance can be retained in the absence of power. In particular embodiments, resistive memory cells may include programmable metallization cells (PMCs) having a solid ion conductor. However, other embodiments may include alternate types of programmable resistive elements.

In one embodiment, a non-volatile memory portion 106 may serve as a "back-up" memory for the volatile memory portion 104. Upon certain conditions (e.g., reset, power-up), data stored by non-volatile memory portion 106 can be written into volatile memory portion 104, which may have faster access speeds than a non-volatile memory portion 106, particularly for write operations. Upon other conditions (e.g., power-down, or a periodic back-up process), data stored within volatile memory portion 104 may be saved (e.g., programmed and/or erased) by having such data written to non-volatile memory section 106.

In this way, one memory device may include a volatile and nonvolatile portion.

Figure 2A:
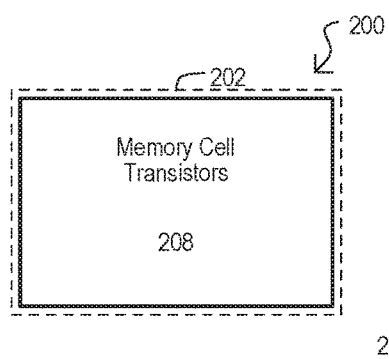
FIGS. 2A and 2B are a top plan views showing a method of making a memory device with a volatile memory portion and non-volatile memory portion formed with resistive memory elements, according to an embodiment.
Figure 2B:
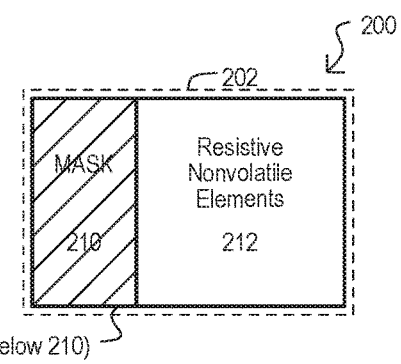

Referring now to FIGS. 2A to 2B, a memory device 200, and method of forming such a memory device, are shown in a sequence of diagrams. FIG. 2A shows the formation of memory cell transistors 208 in and/or on an integrated circuit substrate 202. Memory cell transistors 208 may form active circuit components of memory cells of a memory device. In one embodiment, memory cell transistors 208 may be insulated gate field effect transistors, such as metal-oxide-semiconductor (MOS) type transistors. Still further, in a particular embodiment, memory cell transistors 208 may form the transistor portion of one-transistor (1-T) memory cells. A 1-T cell may include a single transistor in combination with a data storage element.

Referring to FIG. 2B, a volatile memory portion 204 may have a portion masked 210, while programmable resistive elements 212 are formed in contact with memory cell transistors 208. Programmable resistive elements 212 may be programmable between one or more states, to thereby represent different data values. Programmable resistive elements 212, in combination with memory cell transistors, may form a non-volatile resistive memory portion, like that shown as 106 in FIG. 1.

A masked portion 210 may form a volatile memory portion, like that shown as 104 in FIG. 1. In some embodiments, such a volatile portion 204 may be formed prior to being masked as shown in FIG. 2B. A volatile portion 204 may be formed by the fabrication of volatile storage elements (e.g., capacitors, non programmable resistive elements, transistors). In other embodiments, volatile elements may be formed after the formation of programmable resistive elements 212 to thereby create a volatile portion 204. In still other embodiments, a volatile portion 204 may be formed by creating interconnections between memory cell transistors (e.g., six-transistor (6-T) and/or eight-transistor (8-T) type static RAM type cells).

In this way, volatile and non-volatile portions of a memory device may share a memory transistor layer, with one portion being masked while the other portion is formed.

Figure 3:
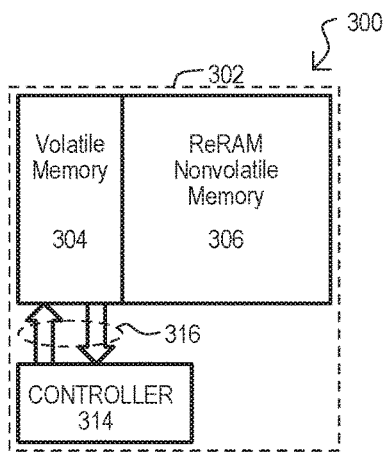
FIG. 3 is a top plan view of a memory device according to an embodiment with a controller that has direct access to storage locations of a volatile memory portion but not a non-volatile memory portion.

Referring now to FIG. 3, a memory device 300 according to another embodiment is shown. Memory device 300 may include a volatile memory portion 304 and a non-volatile resistive memory portion 306 formed in an IC substrate 302. In some embodiments, portions 304 and 306 may have the structures noted for portions 104 and 106 of FIG. 1, or equivalents.

In FIG. 3, a controller 314 may also be formed in IC substrate 302. A controller 314 may be formed from logic circuits, and may access a volatile memory portion 304 through a read/write path 316. A controller 314 may write data into, or read data from, volatile memory portion 304. In a particular embodiment, a nonvolatile resistive memory portion 306 may be a "back-up" memory for data stored in a volatile memory portion 304, as noted above for FIG. 1. In very particular embodiments, a controller 314 may not access resistive memory portion 306 directly via read/write path 316, but rather control back-up or load operations that may transfer data between volatile and nonvolatile portions 304 and 306.

In other embodiments, a controller 314 may be formed in an IC substrate separate from IC substrate 302 containing portions 304 and 306.

In this way, a memory device may include a controller that writes data directly to a volatile portion, with data being transferred between the volatile portion and nonvolatile portion.

Figure 4:
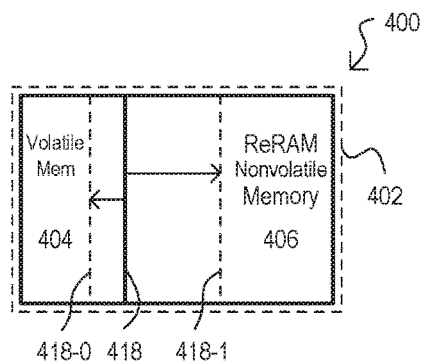
FIG. 4 is a top plan view showing how a memory device can have adjustable sizes for a volatile memory portion and a non-volatile memory portion, according to an embodiment.

Referring now to FIG. 4, a memory device 400 and methods are shown that are directed to a memory device in which a size of a volatile memory portion 404 and nonvolatile resistive memory portion 406 may be adjustable. FIG. 4 shows a memory device 400 in which a boundary 418 can exist between volatile memory portion 404 and nonvolatile resistive memory portion 406. A boundary 418 may be variable, allowing portions 404/406 to be greater or smaller than one another. Such a capability may enable memory device 400 to have different volatile and nonvolatile storage sizes configurable for a given application.

FIG. 4 shows how a boundary 418 may be varied. As but one example, a memory device 400 could have a boundary 418-0 to increase an amount of nonvolatile storage relative to an amount of volatile storage. Alternatively, a memory device 400 could have a boundary 418-1 to decrease an amount of nonvolatile storage relative to an amount of volatile storage.

In one embodiment, a boundary (e.g., 418, 418-0, 418-1) may be determined by the fabrication of memory elements over a same layer of transistors. As but one example, variations in sizes of portions (404 and 406) may be created according to a method like that shown in FIGS. 2A and 2B, by using different mask sizes.

In this way, memory devices may include volatile and non-volatile portions with sized that can be varied.

Figure 5:
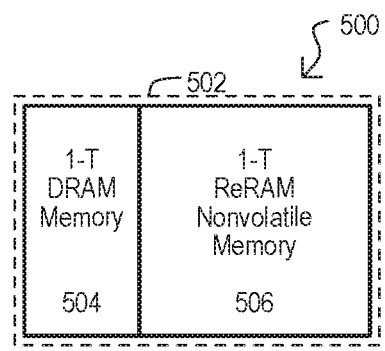
FIG. 5 is a top plan view of a memory device according to an embodiment having a one-transistor (1-T) dynamic random access memory (DRAM) portion and a 1-T resistive RAM (ReRAM) portion according to an embodiment.

Referring now to FIG. 5, memory device according to another embodiment is shown in a top plan view and designated by the general reference character 500. A memory device may be one particular implementation of any of those shown in FIG. 1, 3 or 4.

Memory device 500 may include a one-transistor (1-T) DRAM portion 504 and a 1-T resistive RAM (ReRAM) portion 506 formed in a same substrate 502. A 1-T DRAM portion 504 may include 1-T DRAM memory cells having an access transistor and a storage capacitor. In some embodiments, such DRAM memory cells can include capacitors formed over access transistors. However, in other embodiments, capacitors may be formed in a substrate (e.g., "trench" or other types of capacitors).

A 1-T ReRAM portion 506 can include memory cells having one access transistor, and one or more programmable resistance elements that may be programmed multiple times between different resistance states.

In particular embodiments, a 1-T DRAM portion 504 may provide faster access speeds than a 1-T ReRAM portion 506 and/or may consume less power in read and write operations than corresponding program/erase operations in 1-T ReRAM portion 506. Still further, in some embodiments at a transistor level, 1-T DRAM and 1-T ReRAM cells may have a same layout. That is, the transistor in both portions 504 and 506 can have the same dimensions.

In this way, a memory device may include a volatile portion formed with 1-T DRAM cells and nonvolatile portion formed with 1-T ReRAM cells.

Figure 6A:
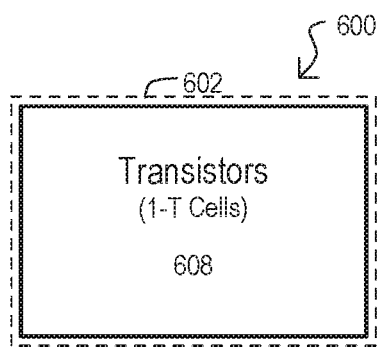
FIGS. 6A to 6C are a top plan views showing a method of making a memory device with a 1-T DRAM portion and a 1-T ReRAM portion according to an embodiment.
Figure 6B:
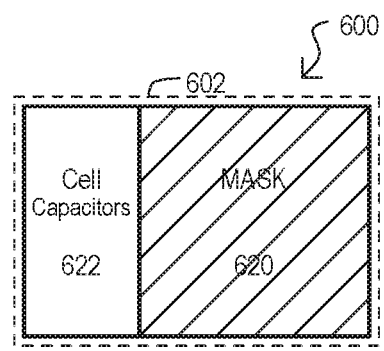
Figure 6C:
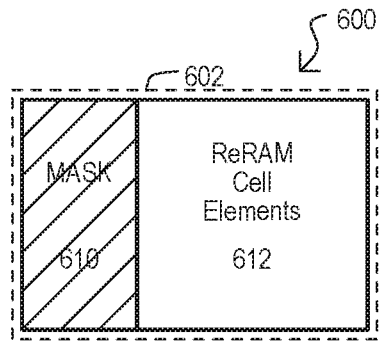

FIGS. 6A to 6C show a memory device 600 and method of forming such a memory device. FIG. 6A shows the formation of memory cell transistors 608 in and/or on an integrated circuit substrate 602. Memory cell transistors 608 may form access devices for 1-T DRAM and 1-T ReRAM memory cells. In a one embodiment, memory cell transistors may be n-channel insulated gate field effect transistors (IGFETs, including MOSFETs). Memory cell transistors 608 may be arranged into one or more arrays having memory cells positioned into rows and columns.

Referring to FIG. 6B, a nonvolatile memory portion may be covered with a mask 620, while storage capacitors 622 are formed in a volatile portion. Capacitors 622 may make contact with single access transistors, to thereby form 1-T DRAM memory cells.

Referring to FIG. 6C, a volatile memory portion may be covered with a mask 610, while programmable resistive elements 612 are formed in contact with single access transistors, to thereby form 1-T ReRAM memory cell transistors. In one embodiment, programmable resistive elements 612 may be programmable metallization cells (PMCs).

In one embodiment, a method like that of FIGS. 6A to 6C may include conventional DRAM manufacturing steps with additional manufacturing steps for forming resistive elements in contact with the same type of transistors and/or transistor layout as the DRAM cells.

In this way, 1-T DRAM volatile and 1-T ReRAM nonvolatile portions of a memory device may share a memory transistor layer, with the 1-T ReRAM portion being masked to form capacitors for the 1-T DRAM portion, and the 1-T DRAM portion being masked to form resistive elements for the 1-T ReRAM portion.

Referring now to FIGS. 7A to 7C, another memory device 700 and corresponding method of forming such a device are shown in a sequence of top plan views.

FIG. 7A shows the formation of memory cell transistors 708 in and/or on an integrated circuit substrate 702. FIG. 7A shows two particular memory cells 724-0/1 following various formation steps. Each memory cell 724-0/1 may include an access transistor 730-0/1 connected to a corresponding bit line 728-0/1, and controlled by a corresponding word line 726-0/1. FIG. 7A shows an access transistor that is an n-channel transistor 730-0/1 having a source-drain path connected to a corresponding bit line 728-0/1, and a gate connected to a corresponding word line 726-0/1.

Referring to FIG. 7B, in a volatile portion 704, storage capacitors may be formed connected to memory cells formed therein, to thereby create DRAM memory cells. Accordingly, memory cell 724-0 may have a capacitor 732 connected to access transistor 730-0. Memory cell 724-1 may reside within a nonvolatile portion 706, and thus may not have a storage capacitor.

Referring to FIG. 7C, in a nonvolatile portion 706, resistive elements may be formed connected to memory cells to thereby create ReRAM memory cells. Accordingly, FIG. 7C shows memory cell 724-1 having a resistive element 734 formed connected to access transistor 730-1.

Referring now to FIGS. 8A to 8D, one particular method of forming a memory device 800 according to an embodiment is shown in a series of side cross sectional views.

Figure 8A:
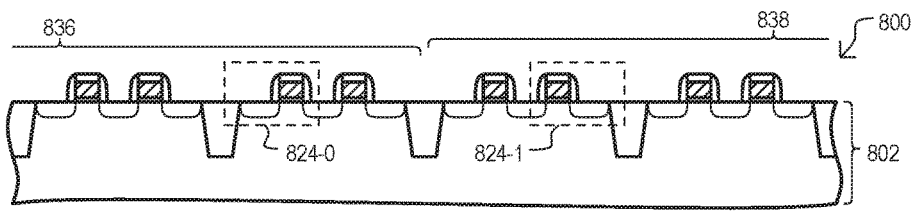
FIGS. 8A to 8D are side cross sectional views showing a method of making a memory device with volatile and ReRAM memory cells formed above bit lines according to one embodiment.

FIG. 8A shows the formation of memory cell transistors (two shown as 824-0/1) in an IC substrate 802. Transistors (824-0/1) may be (IGFETs, such as MOS type transistors, for example.

Figure 8B:
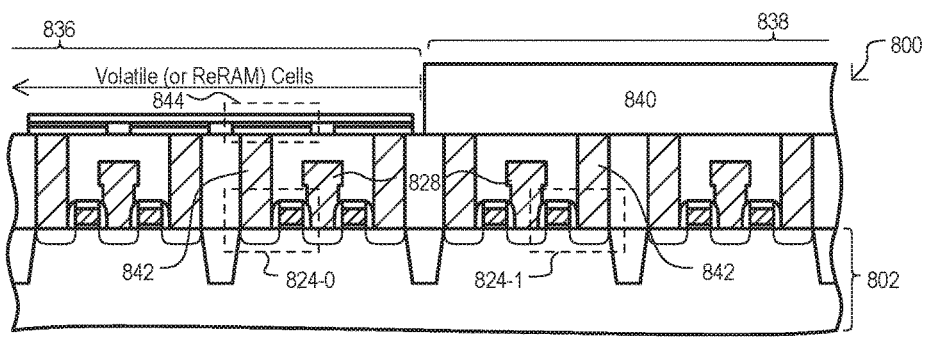

FIG. 8B shows the formation of a first portion 836 (e.g., volatile or ReRAM). Contacts (two shown as 842) and bit lines (two shown as 828) may be formed to transistors (824-0/1). In the embodiment shown, a mask 840 may be formed over a second portion 838. A first type of memory element (e.g., capacitor or programmable metallization cell (PMC)) (one shown as 844) may be formed in contact with transistors (824-0) of the first portion 836.

Examples of PMCs are shown in U.S. Pat. No. 6,635,914, issued to Kozicki et al. and U.S. Pat. No. 7,359,236 issued to Gilbert.

Figure 8C:
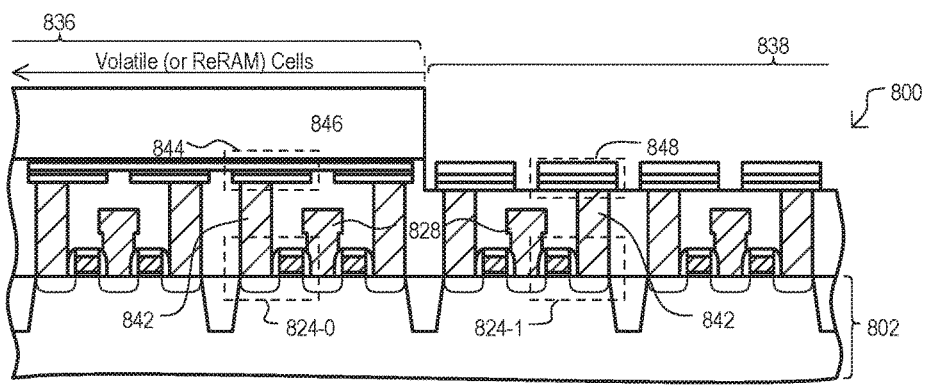

FIG. 8C shows the formation of a second portion 838 (e.g., ReRAM or volatile). In the embodiment shown, a mask 846 may be formed over a first portion 836. A second type of memory element (e.g., PMC or capacitor) (one shown as 848) may be formed in contact with transistors (824-1) of the second portion 838.

Figure 8D:
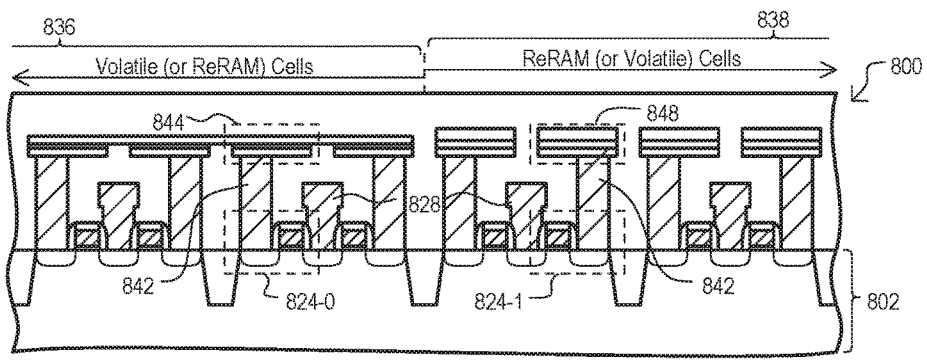

FIG. 8D shows the formation of additional layers overlying first portion 836 and second portion 838.

It is understood that one of the memory elements (844 and 848) may be a capacitor, and in such an arrangement, FIG. 8D can show a capacitor-over-bit line (COB) type DRAM volatile portion.

Figure 9:
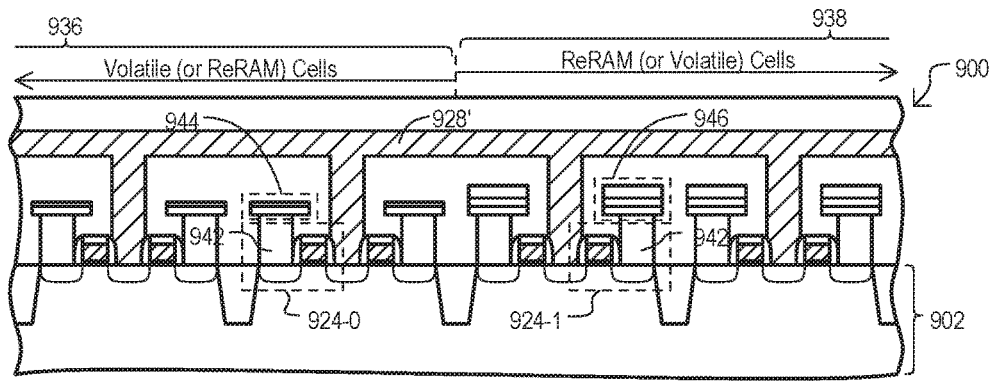
FIG. 9 is a side cross sectional view showing a memory device with volatile and ReRAM memory cells formed below bit lines according to one embodiment.

Referring now to FIG. 9, a memory device according to a further embodiment is shown in a side cross sectional view, and designated by the general reference character 900. Memory device 900 may include items like those of FIG. 8D, and such like items are referred to by the same reference character, but with the first digit being "9" instead of "8".

FIG. 9 differs from FIG. 8D in that a bit line 928' may be formed over memory elements 844 and 848.

It is understood that one of the memory elements (944 and 948) may be a capacitor, and in such an arrangement, FIG. 9 can show a bit line-over-capacitor (BOC) type DRAM volatile portion.

Figure 10:
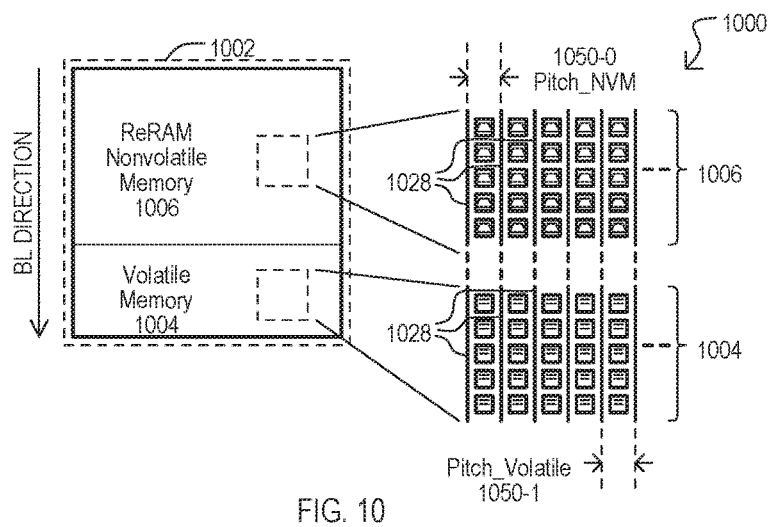
FIG. 10 is a top plan view showing a memory device with volatile and resistive non-volatile portions with a same sized pitch according to an embodiment.

FIG. 10 shows a memory device 1000 having a volatile portion 1004 and a nonvolatile resistive memory portion 1006 according to a further embodiment. FIG. 10 shows a bit line direction (with an arrow) for the memory device 1000.

In the embodiment of FIG. 10, volatile portion 1004 and nonvolatile portion 1006 may share bit lines (some shown as 1028). Further, a nonvolatile portion bit line pitch 1050-0 may be the same as a volatile bit line pitch 1050-1.

A same bit line pitch may allow nonvolatile memory portion 1006 to be formed with the same masks and processes used to form bit lines in a volatile memory portion 1004.

In this way, a memory device can have a volatile portion and a nonvolatile resistive memory portion with a same column direction pitch.

Figure 11:
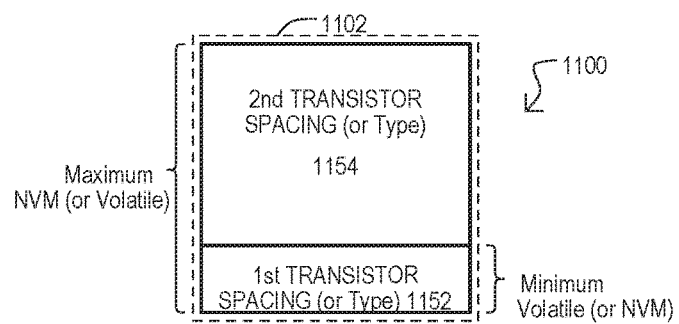
FIG. 11 is a top plan view showing a memory device in which a volatile or resistive non-volatile portion may include transistors with different spacings or sizes according to an embodiment.

FIG. 11 shows a memory device 1100 according to another embodiment in which memory cell transistors may have a different spacing and/or be of different types.

In one embodiment, a memory device 1100 may include a substrate 1102 having memory cell transistors with a first spacing 1152 and memory cell transistors having a second spacing 1154. In one variation, one transistor spacing (1152 or 1154) may be for one memory type (volatile or resistive nonvolatile), while the other transistor spacing (1154 or 1152) may be for another memory type (resistive nonvolatile or volatile).

In contrast, in another variation, one transistor spacing (1152 or 1154) may be suitable for both memory types (volatile and resistive nonvolatile). That is, either volatile or nonvolatile memory cells may be formed at this first transistor spacing. However, the other transistor spacing (1154 or 1152) may be compatible with but one memory type (volatile or resistive nonvolatile).

In another embodiment, a memory device 1100 may have one portion 1152 formed with transistors of a first type, as well as another portion 1154 formed with transistors of a second type. Different transistor types may include high and low voltage transistors (i.e., transistors designed to have different tolerances with respect to applied voltages), different sized transistors (channel width and/or length), and/or other variations in manufacturing (e.g., threshold voltage, gate insulator thickness, etc.).

In one variation, one transistor size or type (1152 or 1154) may be for one memory type (volatile or resistive nonvolatile), while the other transistor size or type (1154 or 1152) may be for another memory type (resistive nonvolatile or volatile).

However, as in the case of different transistor spacing, in another variation, one transistor type or size (1152 or 1154) may be suitable for both memory types (volatile and resistive nonvolatile), while another transistor type or size (1152 or 1154) may be suitable for one memory type (volatile or resistive nonvolatile).

In a particular embodiment, different portions of a memory device (volatile or resistive nonvolatile) may have different sized access transistors already existent in conventional DRAM designs. As but one very particular example, access devices in a volatile portion may be formed like conventional access devices of a DRAM array, which are typically minimum feature size devices. However, access devices in a non-volatile resistive portion may correspond to conventional DRAM periphery transistors, which are typically larger than conventional DRAM array access devices.

Referring now to FIG. 12 shows a memory device 1200 in which one memory portion (Volatile or ReRAM) may extend over memory cells having different spacings and/or of different types is shown in side cross sectional view.

FIG. 12 may include items like that of FIG. 8D. However, FIG. 12 shows memory cell transistor of different spacing/type (1252 and 1254) formed in substrate 1202. In the embodiment shown, a first memory portion 1236 may include both transistors of a first spacing/type 1252 as well as some transistors of a second spacing/type 1254.

Accordingly, while a device may be manufactured with different transistor spacings and/or sizes, a memory portion type (e.g., Volatile or ReRAM) may not be limited to one particular transistor size/spacing. Such an arrangement may enable sizes of volatile and nonvolatile portions to be varied with respect to one another.

Figure 13A:
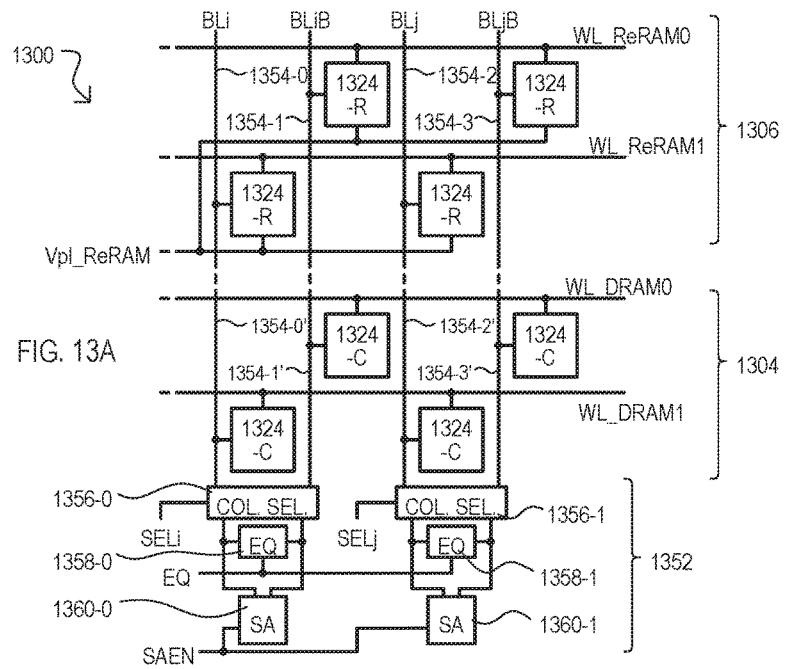
FIGS. 13A to 13C are block schematic and timing diagrams showing a memory device having volatile and resistive non-volatile memory sections and corresponding data load and write operations, according to particular embodiments.
Figure 13B:
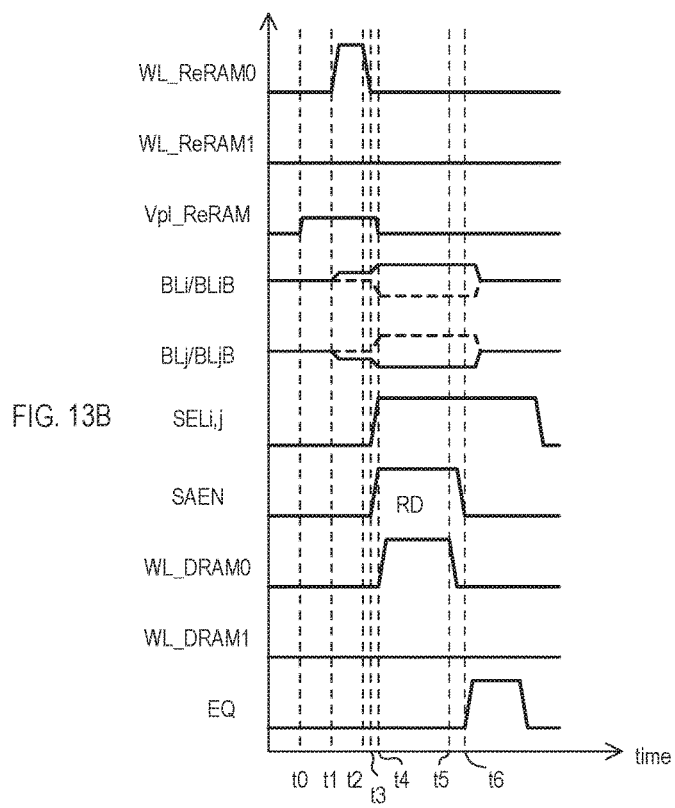
Figure 13C:
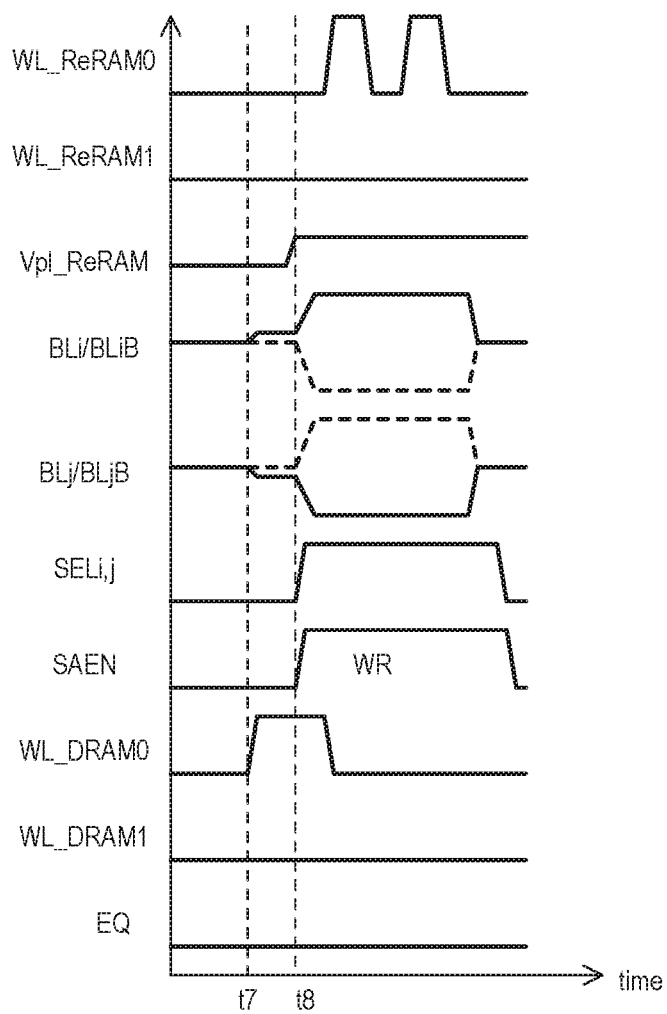

Referring now to FIGS. 13A and 13C, a memory device 1300 and a corresponding data loading operation and data writing operation is shown in a block schematic diagram and timing diagrams.

FIG. 13A shows a memory device 1300 having a volatile memory portion 1304, a nonvolatile resistive memory portion 1306, and a sense/write portion 1352. A volatile memory portion 1304 may include volatile memory cells 1324-C, which in this embodiment may be DRAM memory cells. Each volatile memory cell 1324-C may be accessed by a corresponding word line (WL_DRAM0/1). DRAM memory cells 1324-C may be connected to bit lines 1354-0'-3'.

A nonvolatile restive memory portion 1306 may include resistive memory cells 1324-R, which in this embodiment may be memory cells with PMCs. Each nonvolatile memory cell 1324-R may be accessed by a corresponding word line WL_ReRAM0/1). ReRAM memory cells 1324-R may be connected to bit lines 1354-0-3.

In one embodiment, bit lines 1354-0'-3' of volatile section 1304 may be connected to corresponding bit lines 1354-0-3 of nonvolatile section 1306. Such a connection may be direct (i.e., bit lines 1354-0-3 have a direct conductive connection with bit lines 1354-0'-3', respectively). Alternatively, such a connection may be indirect (i.e., via intervening circuits). Particular examples of indirect connection are shown in other embodiments below. A connection between bit lines 1354-0'-3' of volatile section 1304 and bit lines 1354-0-3 of nonvolatile section 1306 may enable data to be transferred between ReRAM memory cells 1324-R and DRAM memory cells 1324-C connected to such bit lines.

A sense/write portion 1352 may include column select circuits 1356-0/1, equalization circuits 1358-0/1, and sense amplifiers 1360-0/1. Column select circuits 1356-0/1 may connect bit lines to equalization circuits 1358-0/1 and sense amplifiers 1360-0/1.

Equalization circuits 1358-0/1 may equalize bit line pairs prior to a write (and optionally read) operation. In some embodiments, equalization circuits 1358-0/1 may equalize bit lines to a predetermined voltage (Veq) provided from a reference voltage source.

Sense amplifiers 1360-0/1 may amplify a voltage differential on bit line pairs sufficient to either discharge or charge a storage capacitor within a DRAM cell (1324-C). Such a charging may be sufficient to store data on a capacitor for a predetermined data retention time.

FIG. 13B shows a timing diagram of one particular data loading operation.

At about time t0, a ReRAM "plate" voltage (Vpl_ReRAM) may be driven to a predetermined active level. Such a level may be sufficient to pull a bit line above an equalization voltage (Veq) if a resistive element has a low resistance, or pull a bit line below voltage Veq if a resistive element has a high resistance.

At about time t1, a word line for selected ReRAM cell(s) (in the example shown WL_ReRAM0) may be activated, connecting ReRAM cell(s) to bit lines. Based on a state of resistive elements, a bit line may be driven higher or lower than an equalization voltage Veq. In FIG. 13B, for bit line pair BLi/BLiB, bit line BLi may be driven above Veq, while bit line BLiB may remain at about Veq. In contrast, for bit line pair BLj/BLjB, bit line BLj may be driven below Veq, while bit line BLjB may remain at about Veq.

At about time t2, word line WL_ReRAM0 and return to a de-activated state, isolating corresponding ReRAM cells from bit lines. At about the same time or afterward, a plate voltage Vpl_ReRAM may return to an inactive level.

At about time t3, column select signals SELi/j may be activated, connecting bit lines to sense amplifiers and equalization circuits. At about the same time, or shortly afterward, a sense amplifier enable signal SAEN may be activated, and sense amplifiers may drive bit line pairs in opposing directions based on a pre-existing differential voltage on the bit line pairs.

At about time t4, a word line for selected DRAM cell(s) (WL_DRAM0) may be activated, connecting DRAM cell(s) to bit lines. According to bit line voltages established by sense amplifier driving, a corresponding storage capacitor may be charged or discharged, and thereby be written with a data from a corresponding ReRAM cell.

At about time t5, word line WL_DRAM0 my return to a de-activated state, isolating corresponding DRAM cells from bit lines. At about the same time or afterward, a signal SAEN may also return to an inactive level, disabling sense amplifiers.

At about time t6, an equalization signal may be activated placing bit line pairs at an equalization voltage Veq.

FIG. 13C shows a timing diagram of one particular data write operation.

At about time t7, data may be read from a volatile memory portion by activating word WL_DRAM0. Such data may be amplified by sense amplifiers according to a stored value. Thus, bit lines may be driven according to data values stored in a volatile portion.

At about time t8, a write operation may take place. A ReRAM word line (WL_ReRAM0) may be activated one or more times (in this example twice). A voltage between bit lines and a plate voltage may be sufficient to program or erase a ReRAM element to a desired state. Of course, while FIG. 13C shows a write operation where ReRAM plate voltage may be maintained at one level, in other architectures, a plate voltage may be varied.

In addition or alternatively, program and erase operations may be separate operations. As but one example, data read from a volatile portion may be latched. If such latched data has one value (e.g., 1), bit lines corresponding to such values may be driven to a program voltage, while data values with another value (e.g., 0) may be driven to a de-select voltage, which can prevent programming. Conversely, for latched data having the second value (e.g., 0), bit lines corresponding to such values may be driven to an erase voltage, while data values with the first value (e.g., 1) may be driven to a de-select voltage, which can prevent erasing.

In still further embodiments, accessed ReRAM locations may all be erased, and then selectively programmed, or vice versa.

Accordingly, it is understood that FIGS. 13A to 13C show but particular embodiments, and should not be construed as limiting.

FIG. 14 shows an example of memory device 1400 having intervening circuit 1462 between a volatile portion 1404 and a nonvolatile portion 1406. Volatile and nonvolatile portions (1404 and 1406) may take the forms of embodiments shown herein or equivalents. Intervening circuits can enable a transfer of data between the portions (1404 and 1406).

FIGS. 15A to 15E show various examples of possible intervening circuits like that shown as 1462 in FIG. 14. Embodiments may include any of these intervening circuits, or equivalents.

FIG. 15A shows a gate circuit 1564 that may selectively connect nonvolatile memory cell bit lines 1554-1 to volatile memory cell bit lines 1554-0 based on a connection signal (CONN). In one embodiment, a gate circuit 1564 may isolate volatile bit lines and/or memory cells from erase and/or programming voltage utilized to write data into resistive nonvolatile memory cells. A gate circuit 1564 may enable a capacitance of bit lines in nonvolatile portion to be isolated from bit lines of a volatile portion.

FIG. 15B shows program/erase circuits 1566 that may be formed between nonvolatile memory cell bit lines 1554-1 and volatile memory cell bit lines 1554-0. Program/erase circuits 1566 may receive control signals CTRL, a program voltage Vp, and an erase voltage Ve. In response to control signals CTRL, program/erase circuits 1566 may apply voltage Vp/Ve to bit lines to thereby program and/or erase resistive nonvolatile memory cells (NV). Program/erase circuits 1566 may include registers/latches for storing data on volatile memory cell bit lines 1554-0 for subsequent writing into nonvolatile memory cells.

FIG. 15C shows a decoder circuit 1568 that may selectively connect particular nonvolatile memory cell bit lines 1554-1 to volatile memory cell bit lines 1554-0 based on address information. Such an arrangement may allow a selective mapping of data locations between nonvolatile portions and volatile portions based on address values ADD.

FIG. 15D shows a data error circuit 1570 that may provide error detection and/or error correction capabilities. As data are transferred between a volatile portion and a nonvolatile portion, errors may be detected and optionally, corrected. Error detection/correction may be one way (only from volatile portion to nonvolatile, or vice versa), or may be two-way.

FIG. 15E shows a data encoder/decoder 1572 that may encode/decode data values between a volatile portion and a nonvolatile portion. Such a feature may enable data stored in a volatile portion to be encrypted and/or compressed, as but two examples.

Other embodiments may include different types of intervening circuitry.

Referring now to FIG. 16, a particular layout of a memory device 1600 according to an embodiment is shown in a top plan view. A minimum feature size of a manufacturing process that fabricates memory device 1600 may be a value "F".

FIG. 16 shows a volatile portion 1604 and a nonvolatile portion 1606. Both portions (1604 and 1606) may include word lines (WL_ReRAM, WL_DRAM) and bit line contact locations 1674. Resistive storage elements are shown in nonvolatile portion 1606 as R0-R7, and storage capacitors are shown in volatile portion 1608 as C0-C7.

FIG. 16 shows the boundaries of a resistive nonvolatile memory cell with box 1624-R, and the boundaries of a volatile memory cell with box 1624-C. Such memory cells (1624-R/C) may have areas of $6F^2$.

Referring now to FIG. 17, a memory device 1700 according to yet another embodiment is shown in a top plan view. Memory device 1700 may be one version of that shown in FIG. 1, 3 or 4.

Memory device 1700 may include an SRAM portion 1704 and a resistive memory (ReRAM) portion 1706 formed in a same substrate 1702. An SRAM portion 1704 may include SRAM memory cells having latch circuits for retaining data values.

A ReRAM portion 1706 may include memory cells having one or more programmable resistance elements that may be programmed multiple times between different resistance states.

In particular embodiments, an SRAM portion 1704 may provide faster access speeds than a ReRAM portion 1706 and/or may consume less power in read and write operations than corresponding program/erase operations in a ReRAM portion 1706.

In this way, a memory device may include a volatile portion formed with SRAM cells and nonvolatile portion formed with 1-T ReRAM cells.

Referring now to FIGS. 18A to 18C, one example of forming an embodiment like that of FIG. 17 is shown in a sequence of schematic diagrams.

FIG. 18A shows the formation of transistors in a volatile portion 1804 and a nonvolatile portion 1806. As shown, both portions may have four transistors N0R to N3R and N0S to N3S. Transistors within volatile and nonvolatile portions (1804 and 1806) may have a same or similar layout. However, in the embodiment shown, a layout within volatile portion 1804 may differ from that of nonvolatile portion 1806 in that transistors N2S and N3S may not have gates connected by a word line type structure.

FIG. 18B shows the formation of an interconnection structure 1874. An interconnection structure 1874 may provide conductive connections between terminals of transistors N0S to N3S of volatile portion 1806. Interconnection structure 1874 may connect transistors N2S and N3S in a cross-coupled fashion to form a latch. As but one example, interconnection structure 1874 may be formed by any or all of: one or more local interconnect layers, a gate layer, or a "buried contact" structure.

FIG. 18C shows the formation of programmable resistance elements R0 to R3 within nonvolatile portion 1806 to create four 1-T resistive RAM cells (or two, 2-T resistive RAM cells). FIG. 18C also shows the formation of pull-up resistors Z1 and Z0 to create a 4-T SRAM cell. Pull-up resistors Z0/Z1 may or may not be programmable resistance elements in a high resistance state (e.g., unprogrammed PMCs). FIG. 18C also shows bit lines 1854' of volatile portion 1804 as well as bit lines 1854 of a nonvolatile portion 1806.

Referring now to FIGS. 19A to 19D, operations for an embodiment like that of FIG. 3 are shown in block schematic diagrams.

Figure 19A:
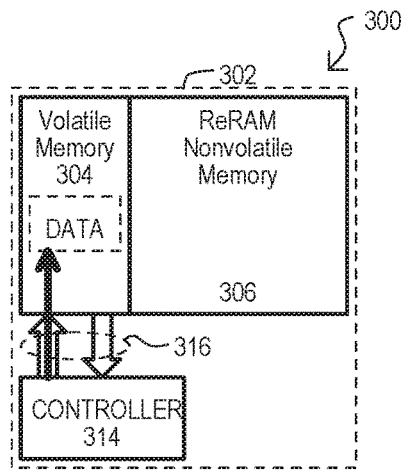
FIGS. 19A to 19D are block diagrams showing write, read, backup, and load operations for a memory device having a volatile portion and a resistive non-volatile portion according to embodiments.

FIG. 19A shows a controller write operation. A controller 314 may write data (DATA) into a volatile portion 304. While FIG. 19A shows a data path originating from controller 314, other embodiments may have write data originating from a data bus.

Figure 19B:
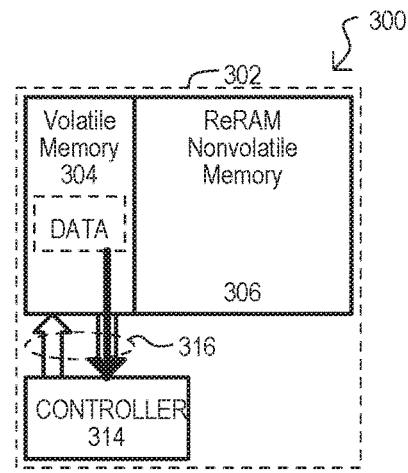

FIG. 19B shows a controller read operation. A controller 314 may read data from a volatile portion 304. Data stored in volatile portion (DATA) may be read out by controller

314. While FIG. 19B shows a data path directed to controller 314, other embodiments may have read data being output to a data bus.

Figure 19C:
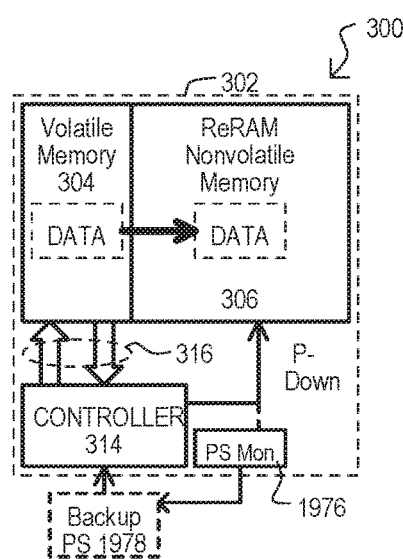

FIG. 19C shows a back-up operation. Control value(s) P-DOWN may be generated by controller 314 or by a power supply management circuit 1976. In a back-up operation, data within volatile portion 304 may be programmed into nonvolatile portion 306. In a particular embodiment, controller 314 may initiate back-up operations in response to predetermined conditions. A power supply management circuit 1976 may initiate a back-up operation in response to a detection of a low (or no) power supply state. In one embodiment, a memory device 300 may additionally include a back-up power supply 1978. A back-up power supply 1978 may provide power to a memory device 300 sufficient to enable data stored in volatile portion 304 to be programmed into nonvolatile portion 306.

Figure 19D:
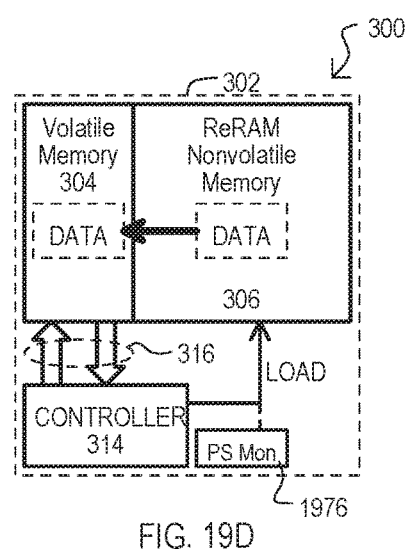

FIG. 19D shows a load operation. Control value(s) LOAD may be generated by controller 314 or by a power supply management circuit 1976. In a load operation, data stored in a nonvolatile portion 306 may be written into a volatile portion 304. In a particular embodiment, controller 314 may initiate load operations in response to predetermined conditions. In addition or alternatively, power supply management circuit 1976 may initiate a load up operation in response to a detection of a power-on or reset operation (POR).

While embodiments herein can include memory devices with volatile and non-volatile resistive portions, other embodiments can include memory devices utilizing vertical bipolar transistors (BJTs) as access devices to programmable impedance elements.

Figure 20:
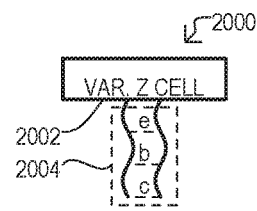
FIG. 20 shows a memory device having a programmable impedance element and bipolar transistor (BJT) access device according to an embodiment.

FIG. 20 shows a memory device 2000 according to an alternate embodiment. A memory device 2000 may include a variable impedance memory element 2002 (hereinafter "element") and an access bipolar junction transistor (BJT) 2004. Element 2002 may provide an impedance that may be programmed between at least two states. In one particular arrangement, element 2002 may include a solid-state ion conductor material.

An access BJT 2004 may enable access to element 2002 for any of: a read operation or a write operation. An access BJT 2004 may be formed all or in part by a film formed over a substrate, or may be formed entirely in a substrate. As shown in FIG. 20, an access BJT 2004 may include an emitter (e), base (b), and collector (c) formed from an semiconductor material. An emitter and collector may be doped to a one conductivity type (e.g., "n" or "p"), while a base may be doped to another conductivity type (e.g., "p" or "n").

Figure 21E:
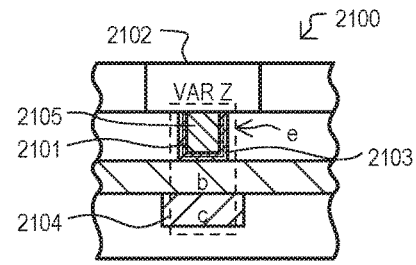
FIGS. 21A to 21E show memory devices having a programmable impedance element and BJT access device according to various embodiments.
Figure 21A:
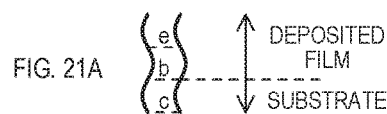

FIG. 21A shows one particular structure for an access BJT, like that shown as 2004 in FIG. 20. In the arrangement of FIG. 21A, an emitter and a base may be formed from one or more deposited films, while a collector may be formed in a substrate. As but one very particular embodiment, an emitter and base may be formed in one or more polycrystalline silicon (polysilicon) films, while a collector may be formed in a substantially monocrystalline silicon substrate.

Figure 21B:
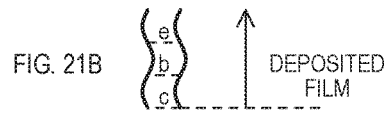

FIG. 21B shows an alternative structure for an access BJT, like that shown as 2004 in FIG. 20. In the arrangement of FIG. 21B, an emitter, base and collector may be formed from one or more deposited films. As but one very particular embodiment, an emitter and base may be formed in a first polysilicon film, while a collector may be formed in a second polysilicon film.

Figure 21C:
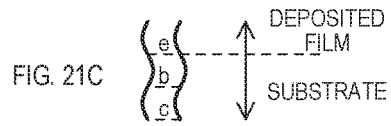

FIG. 21C shows a further structure for an access BJT, like that shown as 2004 in FIG. 20. In the arrangement of FIG. 21C, an emitter may be formed from one or more deposited films, while a base and collector may be formed in a substrate. As but one very particular embodiment, an emitter may be formed in a polysilicon film, while a base and collector may be formed in a substantially monocrystalline silicon substrate.

Figure 21D:
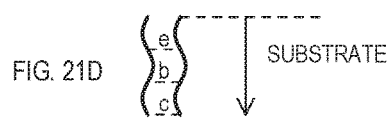

FIG. 21D shows an access BJT, like that shown BJT, like that shown as 2004 in FIG. 20. In the arrangement of FIG. 21D, all portions of the BJT (emitter, base and collector) may be formed in a substrate. As but one very particular embodiment, emitter, base and collector may be formed in a substantially monocrystalline silicon substrate.

While the embodiments of FIGS. 21A to 21D have shown bipolar transistor structures with emitters and collectors formed by junctions of doped semiconductor materials, in alternate embodiments, such junctions may be formed with a metal-semiconductor contact (e.g., a Schottky-diode type structure). One particular embodiment having such an arrangement in shown in FIG. 21E.

FIG. 21E show a memory device 2100 having an element 2102 and an access BJT 2104, where access BJT 2104 has an emitter structure (e) formed by a metallic structure. In the embodiment shown, an emitter (e) can include a composite layer formed with a layer of titanium nitride (TiN) 2103 and titanium (Ti) 2101. A base (b) may be a semiconductor material, and a contact between the Ti and base material may form a Schottky-diode type structures. A conductive plug 2105 can be formed between element 2102 layers 2103/2102.

Referring back to FIG. 20, an access BJT 2004 may enable a one or more voltage biases to be applied to an element 2002 and/or currents to be drawn through an element 2002. Such voltage biases/currents may determine an impedance of the element (e.g., read operation) and/or may enable an impedance to be altered (e.g., write operation).

In one very particular arrangement, an element 2002 may be a programmable metallization cell (PMC), and a write operation may "program" a PMC to a low resistance state or "erase" a PMC to a high resistance state. A read operation may sense a current drawn through a PMC to thereby determine a value stored by the PMC.

In this way, memory device may include a programmable impedance element access by a BJT.

Figure 22:
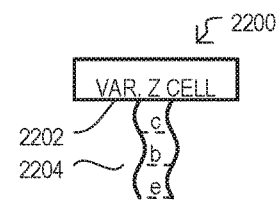
FIG. 22 shows a memory device having a programmable impedance element and BJT access device according to a further embodiment.

FIG. 22 shows a memory device 2200 according to another embodiment. A memory device 2200 may include an element 2202 and an access BJT 2204.

Memory device 2200 may have similar or same structures as that shown in FIG. 20, but may have a collector connected to an element 2202. It is understood that access BJT 2204 may be formed all, or in part, with a semiconductor film formed over a substrate as shown in FIGS. 21A to 21C.

Figure 23:
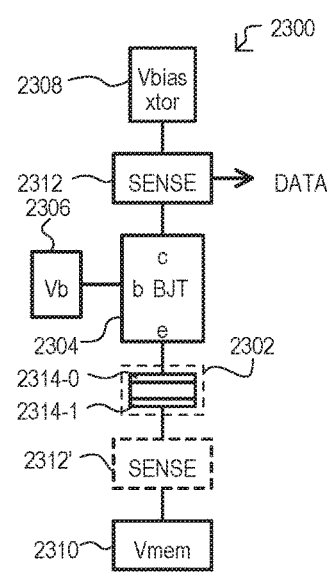
FIG. 23 is a block schematic diagram of a memory device having a programmable impedance element and BJT access device according to an embodiment.

Referring now to FIG. 23, a memory device 2300 according to another embodiment is shown in a block schematic diagram. A memory device 2300 may include an element 2302, access BJT 2304, a base bias circuit 2306, a transistor bias circuit 2308, a memory bias circuit 2310, and a sense circuit 2312.

An element 2302 and access BJT 2304 may have the structures and variations described in FIGS. 20 to 22 and other embodiments described below.

A base bias circuit 2306 may be electrically connected to a base of access BJT 2304. A base bias circuit 2306 may apply a voltage/current to control an access BJT 2304. In one embodiment, a base bias circuit 2306 may provide a base read bias, a base program bias, and a base erase bias.

A transistor bias circuit 2308 may be electrically connected to a collector of access BJT 2304. In one embodiment, a transistor bias circuit 2308 may provide a collector read bias, a collector program bias, and a collector erase bias. However, in an alternate embodiment, in which an element 2302 may be erased by the forward biasing of a base-emitter junction of BJT 2304, a transistor bias circuit 2308 may provide a high impedance during such an erase operation.

A memory bias circuit 2310 may be electrically connected to a terminal 2314-1 of element 2302. In one embodiment, a memory bias circuit 2310 may provide a memory read bias, a memory program bias, and a memory erase bias.

A sense circuit 2312 may determine a state of element 2302 when read bias conditions are established by bias circuits 2306, 2308 and 2310. In one particular embodiment, a sense circuit 2312 may compare a current drawn by a collector-emitter path of access BJT 2304, which may vary according to an impedance of element 2302, to one or more reference currents. Based on such a comparison, a sense circuit 2312 may output a data value DATA. Such a sensing operation may generate a binary value, or may generate a multi-bit output value. Alternatively, a sense circuit (shown as 2312') may be connected to an emitter of access BJT 2304.

Figure 24:
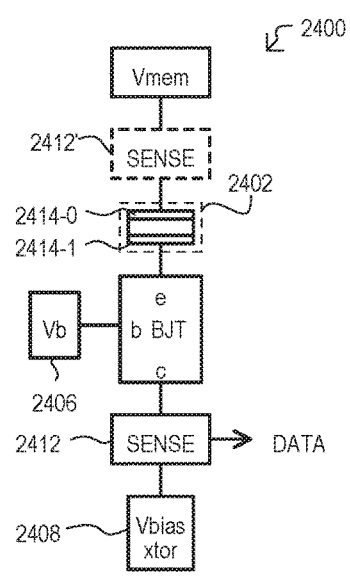
FIG. 24 is a block schematic diagram of a memory device having a programmable impedance element and BJT access device according to another embodiment.

Referring now to FIG. 24, a memory device 2400 according to a further embodiment is shown in a block schematic diagram. A memory device 2400 may include items like those of FIG. 23, and such like items are referred to by the same reference character but with the first two digits being "24" instead of a "23". FIG. 24 may differ from that of FIG. 23, in that an element 2402 may be connected to a collector of access BJT 2404, as opposed to an emitter of such a device.

Figure 25A:
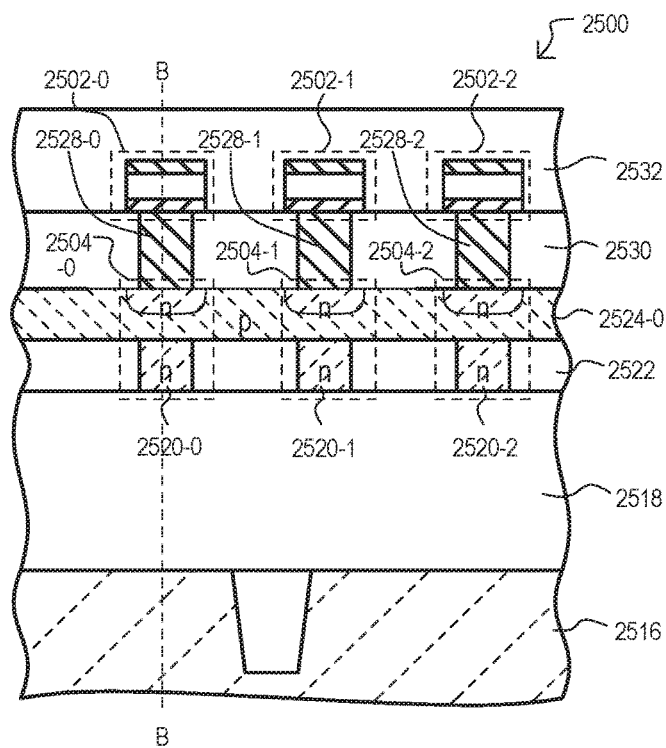
FIGS. 25A and 25B are side cross sectional views showing a memory device having a programmable impedance element and vertical BJT access device according to an embodiment.
Figure 25B:
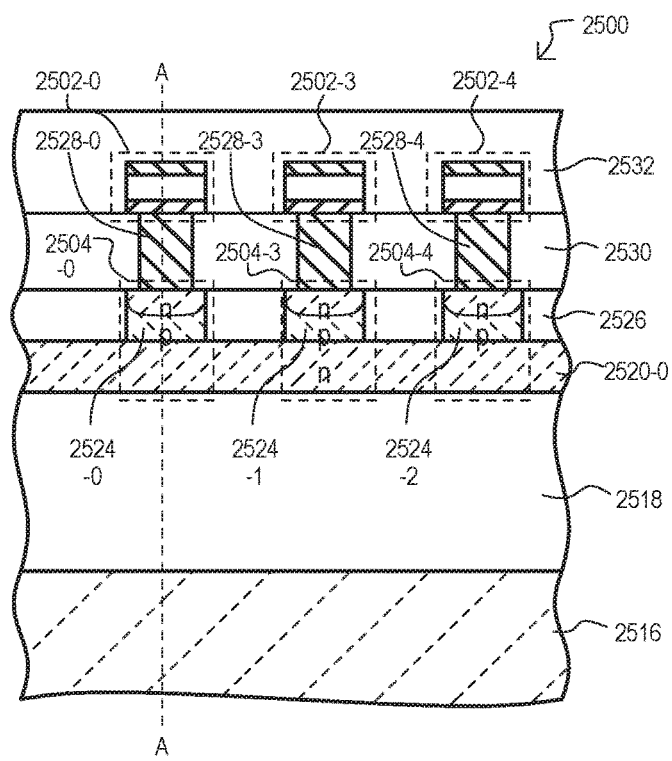

Referring to FIGS. 25A and 25B, a memory device 2500 according to another embodiment is shown in two, side cross sectional views. In the embodiment of FIGS. 25A and 25B, programmable impedance elements may be accessed by vertical BJTs, where such BJTs have a common base region and multiple emitter regions formed in a same deposited semiconductor film.

FIG. 25A shows a cross section along the plane A-A of FIG. 25B, while FIG. 25B shows a cross section along the plane B-B of FIG. 25A.

Referring to FIGS. 25A and 25B, a memory device 2500 may include a substrate 2516, first insulating layer 2518, collector lines 2520-0 to 2520-2, second insulating layer 2522, base-emitter lines 2524-0 to 2524-2, third insulating layer 2526, element contacts 2528-0 to 2528-4, fourth insulating layer 2530, variable impedance elements (hereinafter "elements") 2502-0 to 2502-4, and fifth insulating layer 2532.

Collector lines 2520-0-2 and base-emitter lines 2524-0-2 may form access BJTs 2504-0-4 where such lines cross over one another. In one embodiment, collector lines 2520-0-2 may be arranged in a column direction substantially parallel to one another, while base-emitter lines 2524-0-2 may be arranged in a row direction, substantially perpendicular to collector lines 2520-0-2.

In one embodiment, a substrate 2516 may be a substantially monocrystalline silicon substrate in which active devices (e.g., transistors, which are not shown) may be formed. It is noted that in the embodiment shown, access BJTs 2504-0-4 may be formed entirely above a substrate 2516.

Collector lines 2520-0-2 may be formed from a semiconductor material. In the example shown, collector lines 2520-0-2 may be formed from polysilicon doped to an n-type conductivity. Collector lines 2520-0-2 may be separated from a substrate 2516 by a first insulating layer 2518, and separated from one another by second insulating layer 2522.

Base-emitter lines 2524-0-2 may be formed from a semiconductor layer. In the example shown, base emitter lines 2524-0-2 may be formed from polysilicon doped to a p-type conductivity (p), with n-type regions formed therein (n). Such a p-type region (p) may form a common base for access BJTs 2504-0-2, while n-type regions (n) may be separate emitters for access BJTs 2504-0-2. Base-emitter lines 2524-0-2 may be separated from one another by third insulating layer 2526.

Element contacts 2528-0-4 may contact n-type (i.e., emitter) regions of base-emitter lines 2524-0-2, extend upward through fourth insulating layer 2530, and contact elements 2502-0-2, respectively. Element contacts 2528-0-2 may be formed from one or more conductive materials, and in particular embodiments, may include a metal combination, even more particularly may include tungsten with a TiN/Ti adhesion layer.

Elements 2502-0-4 may each provide an impedance that may be changed by a write operation (e.g., program or erase). In such a write operation, a voltage may be applied to one terminal of elements 2502-0-4 via element contacts 2528-0-2. It is understood that during write operations another voltage that may be applied to a different terminal of elements 2502-0-2. Elements 2502-0-2 may be separated from one another by a fifth insulating layer 2532.

In this way, a memory device may include programmable impedance elements connected to vertical BJTs, where such BJTs are entirely formed above a substrate.

Figure 26A:
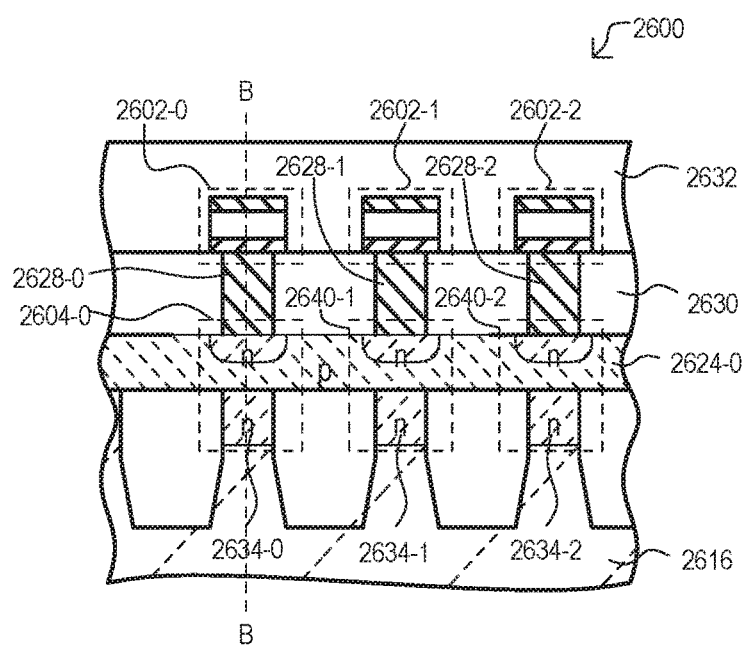
FIGS. 26A and 26B are side cross sectional views showing a memory device having a programmable impedance element and vertical BJT access device according to another embodiment.
Figure 26B:
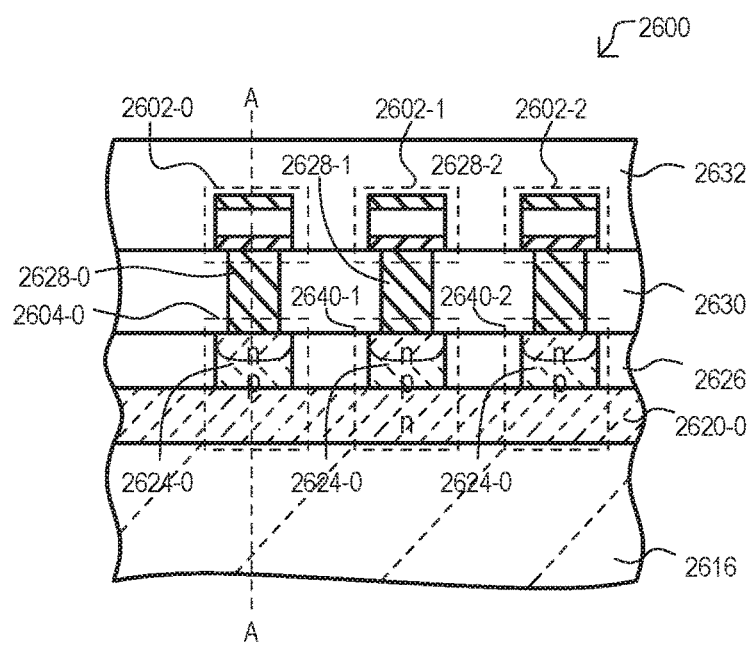

Referring to FIGS. 26A and 26B, a memory device 2600 according to another embodiment is shown in two side cross sectional views. In the embodiment of FIGS. 26A and 26B may include structures like those of FIGS. 25A and 25B, accordingly, like structures are referred to by the same reference character but with the first digits being "26" instead of a "25".

FIG. 26A shows a cross section along the plane A-A of FIG. 26B, while FIG. 26B shows a cross section along the plane B-B of FIG. 26A.

Memory device 2600 may differ from that of FIGS. 25A and 25B, in that collector regions of access BJTs 2604-0-2 may be formed as a portion of substrate 2616. Accordingly, a substrate 2616 may include a p-type region in which n-type collector regions 2634-0-2 may be formed.

While FIGS. 25A to 26B show npn access BJTs, alternate embodiments may include pnp access BJTs by switching conductivity types of base, emitter and collector regions. In addition, while FIGS. 25A to 26B identify particular regions as emitters and collectors, if current flows are in an opposite direction, such regions may be switched.

In embodiments, a direction of current through a cell may be related to the construction of the corresponding programmable impedance memory element. As but one example, if an element is a PMC, a direction of current through an access BJT may depend upon which electrode of a PMC is connected to the device (i.e., "active" electrode or indifferent electrode).

Figure 27A:
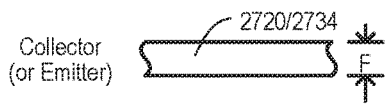
FIGS. 27A to 27C are top plan views showing a method of forming a memory device memory cell having a programmable impedance element and vertical BJT with an area of $4F^2$ according to another embodiment.
Figure 27B:
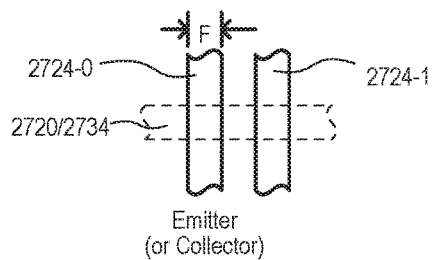
Figure 27C:
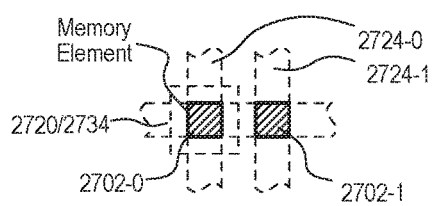

FIGS. 27A to 27C shows how memory cells, formed by a vertical access BJT like those shown in FIGS. 25A to 26B, may form a $4F^2$ area cell (where "F" is a minimum feature size). FIGS. 27A to 27C show a sequence of top plan views of different layers, which in particular examples, may correspond to those of FIGS. 25A to 26B.

FIG. 27A shows collector (or emitter) structure 2720/2734 which may be formed from a layer over a substrate, or within a substrate. Emitter structure 2720/2734 may have a width "F" that may be a minimum feature size achievable for an emitter structure 2720/2734.

FIG. 27B shows base-emitter (or base-collector) structures 2724-0 and 2724-1 formed over and in contact with collector structure 2720/2734. Such base-emitter structures 2724-0/1 may have a width "F" that may be a minimum feature size achievable for the structure, and may be formed substantially perpendicular to emitter structure 2720/2734.

FIG. 27C shows variable impedance elements ("element") 2702-0 and 2702-1 formed over, and at the intersections of collector structure 2720/2734 and base-emitter structures 2724-0-1. Such elements 2702-0-1 may have dimensions "F" that may be a minimum feature size achievable for the structure. FIG. 27C shows a cell area 2736, including sufficient spacing from an adjacent cell. Such a cell area may be $4F^2$.

In this way, elements 2702-0-1 may have a "cross point" arrangement to achieve a compact array of memory cells (each including a vertical access BJT and an element) of compact size.

As will be shown at a later point herein, memory cell sizes smaller than $4F^2$ may be achievable using sub-lithographic feature techniques.

Figure 28:
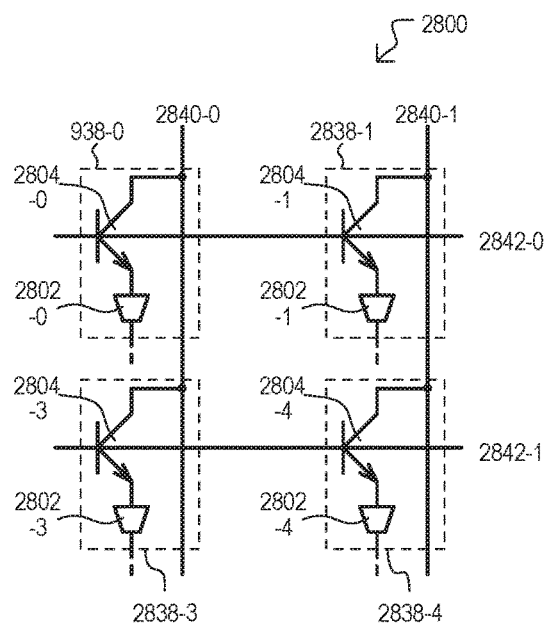
FIG. 28 is a schematic diagram of a memory device having programmable impedance elements and access BJTs according to an embodiment.

Referring now to FIG. 28, a memory device 2800 according to an embodiment is shown in a schematic diagram. A memory device 2800 may include an array of memory cells 2838-0 to 2838-3, each of which includes an access BJT (2804-0 to 2804-3) and a variable impedance element (2802-0 to 2802-3), which in this particular example may be a programmable metallization cell (PMC).

Referring still to FIG. 28, a memory device 2800 may include bit lines 2840-0 and 2840-1, as well as word lines 2842-0 and 2842-1. In particular configurations, bit lines 2840-0-1 may be formed all, or in part, by collector lines like those shown as 2520-0-2/2620-0-2 in FIGS. 25A to 26B. Word lines 2842-0-1 may be formed all, or in part, by base-emitter lines, like those shown as 2524-0-2/2624-0-2 in FIGS. 25A to 26B.

Figure 29:
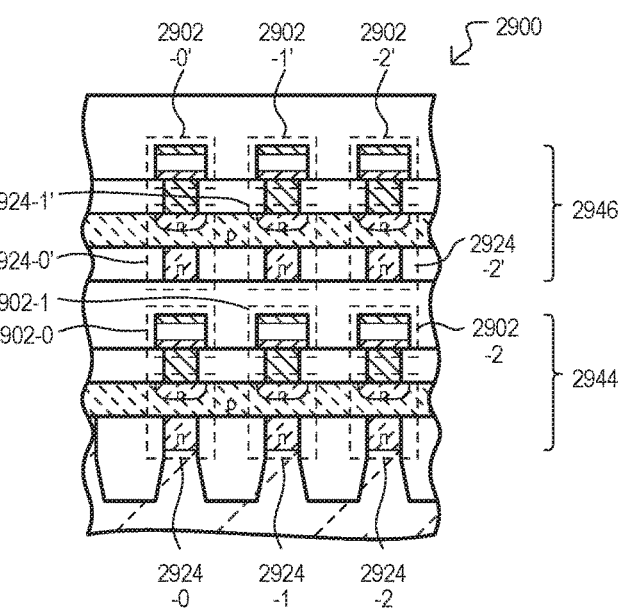
FIG. 29 is a side cross sectional view showing a three dimensional memory device having programmable impedance elements and vertical BJTs according to an embodiment.

FIG. 29 shows one example of a memory device 2900 according to an embodiment having a three dimensional memory cell array according to an embodiment. Memory device 2900 may include a first portion 2944 having a structure like that of FIGS. 26A and 26B, or equivalents. Such a first portion 2944 can include elements 2902-0-2' and access BJTs 2924-0-2'. In addition, a memory device 2900 may include one or more additional portions (one shown as 2946) formed over first portion 2944. Additional portion 2946 can include elements 2902-0-2 and access BJTs 2924-0-2.

In this way, multiple memory arrays may be stacked on top of one another in a same integrated circuit device.

Figure 30:
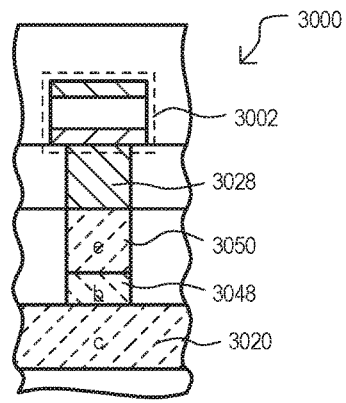
FIG. 30 is a side cross sectional view of a memory device having programmable impedance elements and vertical access BJTs having emitters and bases formed with separate layers according to an embodiment.

Referring now to FIG. 30, a memory device 3000 according to another embodiment is shown in a side cross sectional. In the embodiment of FIG. 30, emitters (e.g., 3050), bases (e.g., 3048), and collectors (e.g., 3048) may be all be formed with different layers. Accordingly, a memory device 3000 may have a structure like that of FIG. 25A/25B or 26A/26B, but rather than having base-emitter lines, a memory device 3000 may include separate base and emitter structures (e.g., 3048, 3050) extending upward from a collector line 3020 to contact a programmable impedance 3002.

Figure 31:
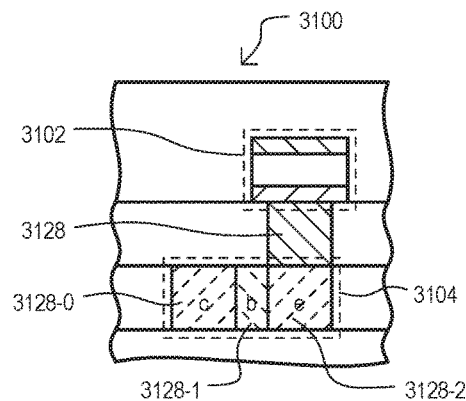
FIG. 31 is a side cross sectional view of a memory device having programmable impedance elements and lateral access BJTs according to an embodiment.

Referring now to FIG. 31, a memory device 3100 according to a further embodiment is shown in a side cross sectional. In the embodiment of FIG. 31, emitters (e.g., 3124-0), bases (e.g., 3148), and collectors (e.g., 3048) may all be formed with a same layer. Accordingly, a memory device 3100 may have a structure like that of FIG. 25A/25B or 26A/26B, but rather than having a vertical access BJT structures, an access BJT 3104 may be a lateral structure, having base, collector and emitters formed in a same layer.

Figure 32A:
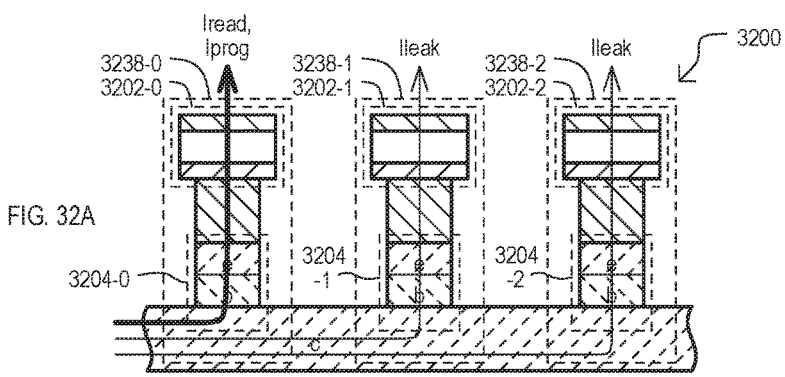
FIGS. 32A to 32C are a side cross sectional view and schematic diagrams showing memory device read and write operations according to embodiments.
Figure 32B:
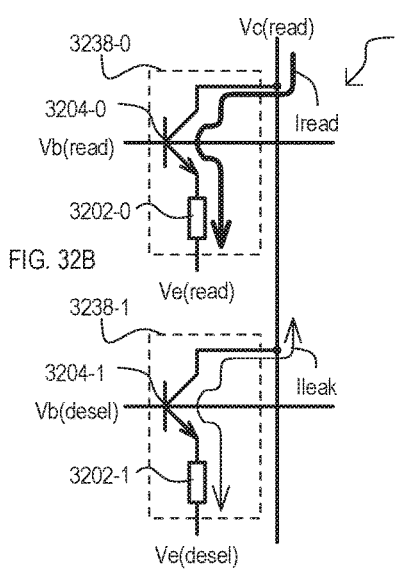
Figure 32C:
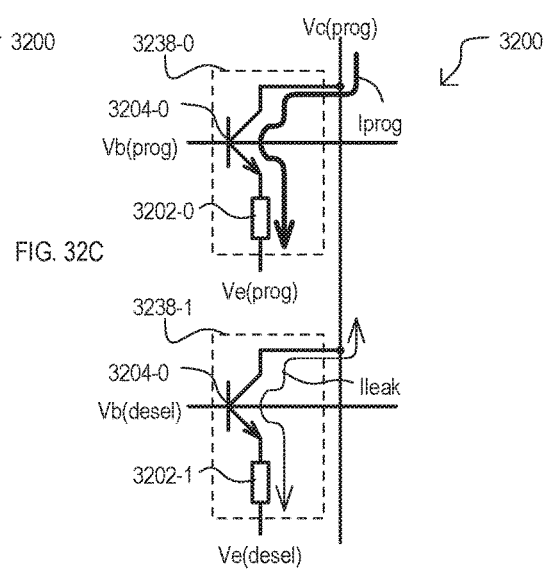

FIGS. 32A to 32C are views showing various operations of a memory device 3200 like those shown herein, or equivalents.

FIG. 32A illustrates an example of a read or program operation for a memory structure like that of FIG. 25A/B or 26A/B. In particular, a memory cell (in this case 3238-0) may have an access BJT 3204-0 biased to induce a collector-emitter current through a variable impedance element ("element") 3202-0. In a read operation, such biasing levels are not sufficient to substantially alter an impedance of element 3202-0. In a program operation (referred to herein as a program operation), such biasing levels may be sufficient to alter an impedance of element 3202-0.

The particular embodiment of FIG. 32A shows a de-selection of other memory cells 3238-1 and 3238-2. In both a read and program operation, biasing level may disable access BJTs 3204-1/2, resulting in such devices drawing substantially no current (represented by Ileak).

FIG. 32B is a schematic diagram showing a read operation like that of FIG. 32A. FIG. 32C is a schematic diagram showing a program operation like that of FIG. 32B. As noted above, in a read operation, an impedance of an accessed element (3204-0) is substantially not affected, while in a program operation, an impedance of such elements may be substantially altered.

Figure 33A:
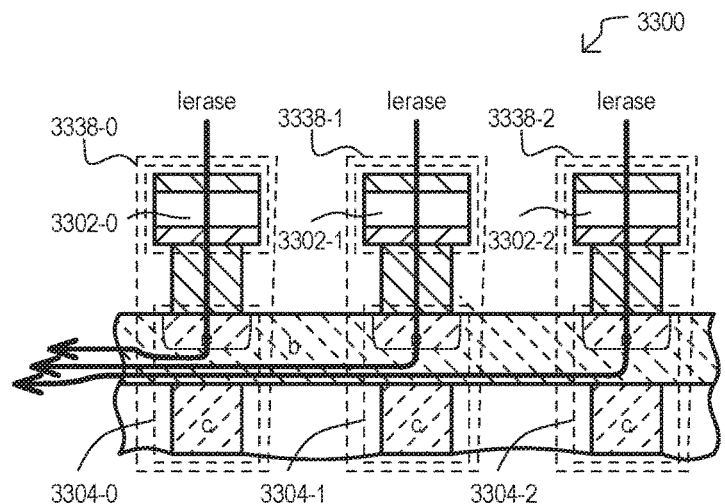
FIGS. 33A and 33B are a side cross sectional view and schematic diagram showing a memory device write operations according to an embodiment.
Figure 33B:
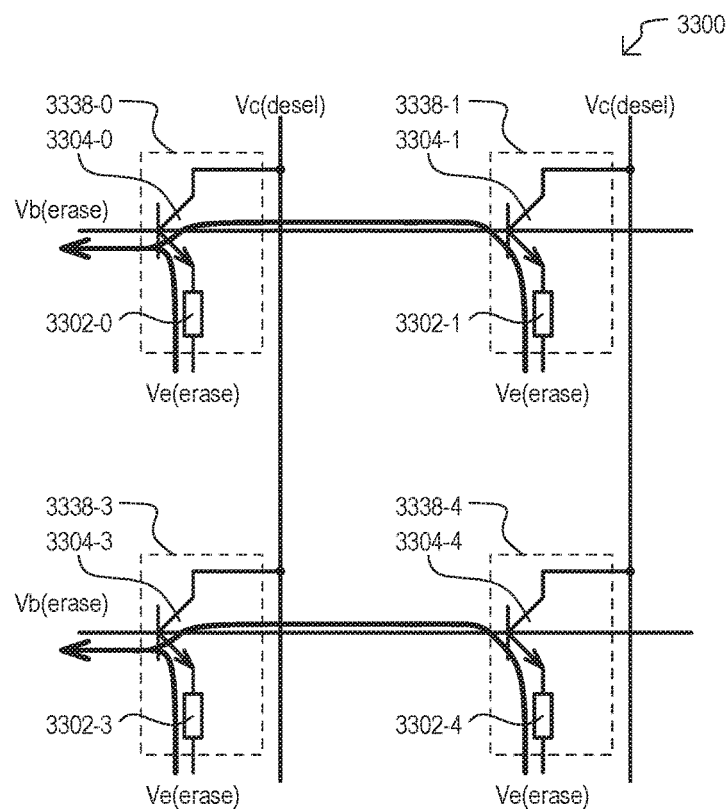

Referring now to FIGS. 33A and 33B, a particular write operation for a memory device 3300 according to an embodiment are shown in a side cross sectional view and a schematic diagram. Such a write operation may induce a change in impedance opposite to that shown in FIG. 32C.

FIG. 33A illustrates an example of a write operation (referred to herein as an erase operation) for a memory structure like that of FIG. 25A/B or 26A/B. In particular, within multiple memory cells (in this case 3338-0 to 3338-2), base-emitter junctions of corresponding access BJTs (3304-0 to 3304-2) within such memory cells may be forward biased. Such a forward biasing may create bias conditions across variable impedance elements ("elements") 3302-0 to 3304-5 that alter an impedance of such elements (assuming such elements were previously "programmed" to a different impedance state). As shown, unlike the read and program operations shown in FIGS. 32A to 32C, groups of memory cells may be erased collectively.

FIG. 33B is a schematic diagram showing a group erase operation like that of FIG. 33A.

Collective erasing as shown in FIGS. 33A and 33B may be advantageous in memories having bipolar access devices, as described herein. Bipolar access devices can be fabricated with a strong current gain for a forward (collector-to-emitter) direction. In contrast, current flow in the reverse (emitter-to-collector) may be substantially less than the forward direction. Consequently, if a forward direction current is used to program memory elements, a reverse direction current may not be sufficient for an erase operation the requires a current flow in the opposite direction. Thus, erasing via the forward biasing of a base-emitter junction may provide sufficient reverse direction current, if needed.

It is understood that in other embodiments, such an erase approach may not be included or needed. For examples, for "unipolar" memory elements (i.e., memory elements that are programmed and erased with a current flow in the same direction) or memory elements having a low write (i.e., program and/or erase) current, a reverse current may not be needed, or may be sufficient to erase (or program).

Referring now to FIGS. 34A to 34H, a method of making a memory device according to an embodiment is shown in a series of side cross sectional views. FIGS. 34A to 34H show npn access BJTs. However, alternate embodiments may also include pnp access BJTs by reversing the conductivity types of the base, emitter and collector of any such device.

Figure 34A:
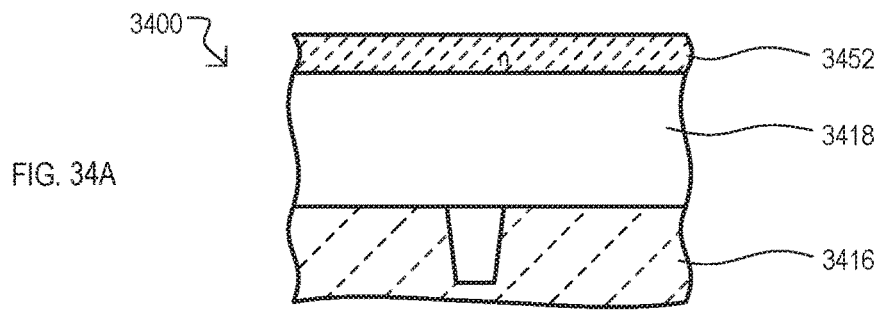
FIGS. 34A to 34H are a sequence of side cross sectional diagrams showing a method of fabricating a memory device having programmable impedance elements and vertical access BJTs according to an embodiment.

FIG. 34A shows the formation of a first semiconductor layer 3452 over a substrate 3416. A semiconductor layer 3452 may be suitable to form collectors (or alternatively emitters) for access bipolar transistors. In the example shown, first semiconductor layer 3452 may be formed on a first insulating layer 3418. In one embodiment, a first semiconductor layer 3452 may be polysilicon doped to an n-type conductivity. Such doping may be done in situ, and/or via ion implantation performed after the layer is deposited.

Figure 34B:
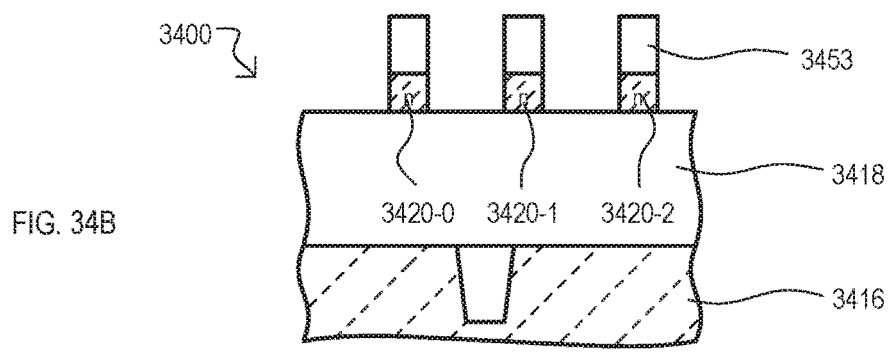

FIG. 34B shows a patterning of first semiconductor layer 3452 to form collector lines 3420-0-2. In one embodiment, photolithographic steps (or equivalent methods), may form a collector line etch mask 3453. Reactive ion etching (or equivalent methods) may etch first semiconductor layer 3452 to form collector lines 3420-0-2.

Figure 34C:
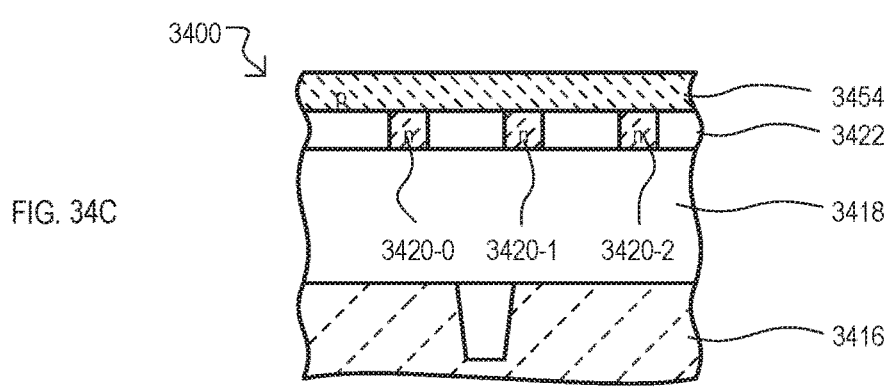

FIG. 34C shows the formation of a second semiconductor layer 3454 over and in contact with collector lines 3420-0-2. A second semiconductor layer 3454 may be suitable to form a base and emitter (or alternatively, a base and collectors) for access BJTs. In the example shown, second semiconductor layer 3454 may be formed on and in contact with collector lines 3420-0-2, which can be separated from one another by a second insulating layer 3422. In one embodiment, a second semiconductor layer 3454 may be polysilicon doped to a p-type conductivity. Such doping may be done in situ, and/or via ion implantation performed after the layer is deposited.

Figure 34D:
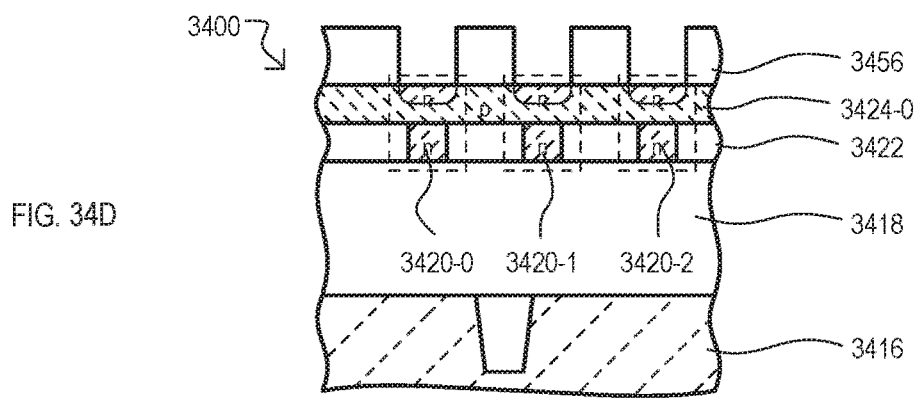

FIG. 34D shows the formation of emitter (or alternatively collector) regions within second semiconductor layer 3454. Such a step may form multiple emitter regions within semiconductor layer 3454. In one embodiment, such a step may include forming an emitter implant mask 3456 over semiconductor layer 3454, then ion implanting to form n-type regions that partially extend into semiconductor layer 3454. In one particular approach, a mask that forms emitter implant mask 3456 may be the same as that which forms collector lines 3420-0-2.

Following the formation of emitter regions within semiconductor layer, such a layer may be patterned into base-emitter lines (one shown as 3424-0) that are substantially perpendicular to collector lines 3420-0-2. Such an action may include patterning steps like those that form collector lines 3420-0-2, and equivalents. A third insulating layer (not shown) may then be formed between such lines.

Figure 34E:
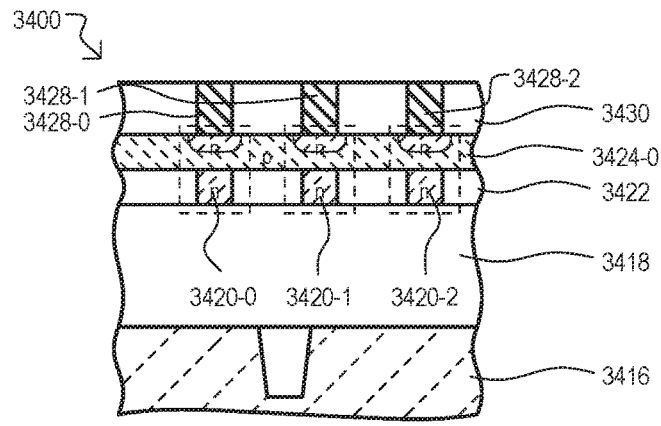

FIG. 34E shows the formation of element contacts 3428-0-2. Element contacts 3428-0-2 may make contact with emitter region (but not any of the base region) of base-emitter line 3424-0. In one particular example, such an action may include depositing a fourth insulating layer 3430. Openings may then be created within such a layer to expose emitter regions of base-emitter line 3424-0. Photolithographic and reactive ion etching techniques, or equivalents, may be used to form such openings. One or more metallization films may then be deposited into such openings. As but one very particular example, a layer of titanium-nitride may be deposited followed by tungsten. A planarization step, such as chemical-mechanical polishing or equivalents, may planarize to expose a top surface of third insulating layer 3430, as well as tops of element contacts 3428-0-2.

Figure 34F:
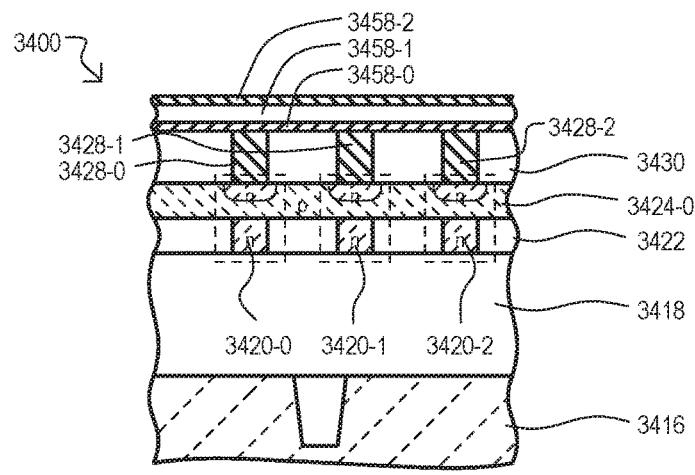

FIG. 34F shows the formation of variable impedance element ("element") layers 3458-0-2. Element layers 3458-0-2 may be those materials for creating an array of elements for a memory device. In one embodiment, elements may be PMCs, and element layers may include a first electrode layer 3458-0, an ion conductor layer 3458-1, and a second electrode layer 3458-2.

Figure 34G:
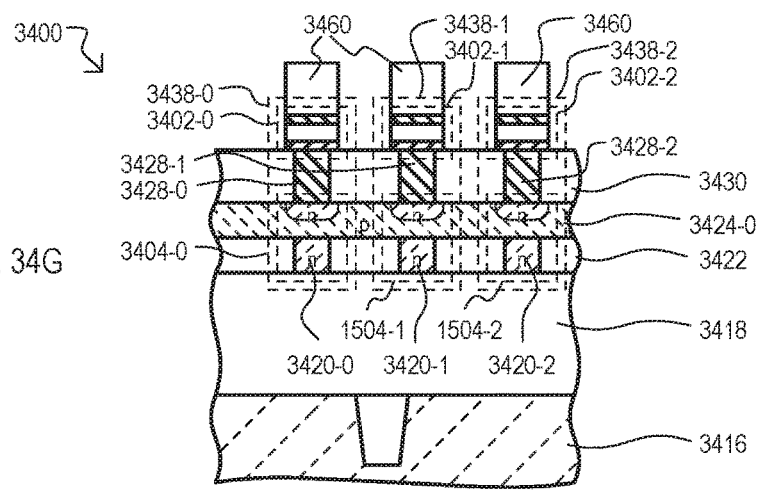

FIG. 34G shows a patterning of element layers 3458-0-2 to form elements 3402-0-2. In one embodiment, photolithographic steps (or equivalent methods), may form an element etch mask 3460. Reactive ion etching (or equivalent methods) may etch element layer 3458-0-2 to form elements 3404-0-2.

Figure 34H:
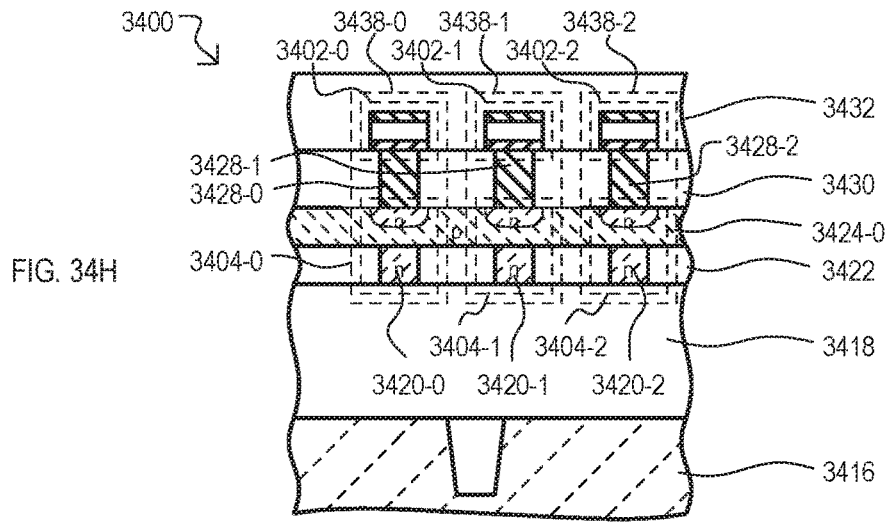

FIG. 34H shows the formation of a fifth insulating layer 3432 over elements 3404-0-2.

Figure 35A:
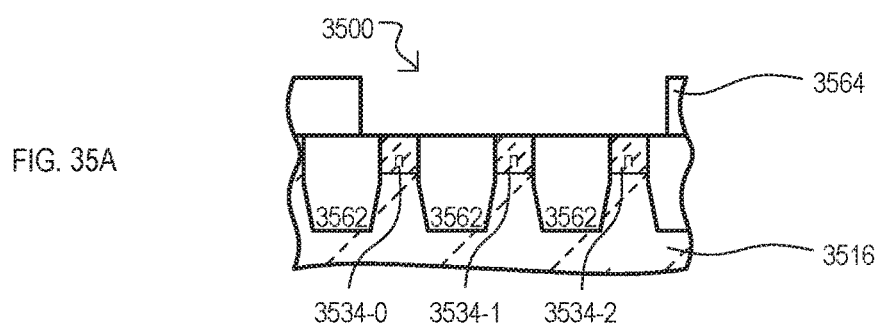
FIGS. 35A to 35C are a sequence of side cross sectional diagrams showing a method of fabricating a memory device having programmable impedance elements and vertical access BJTs according to another embodiment.
Figure 35B:
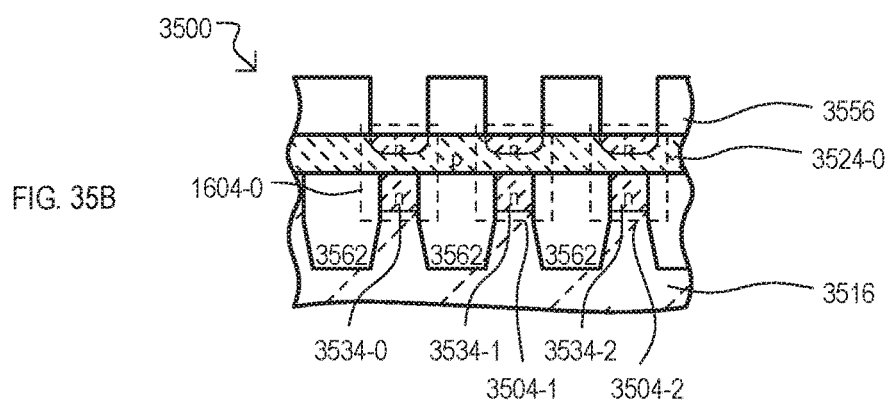
Figure 35C:
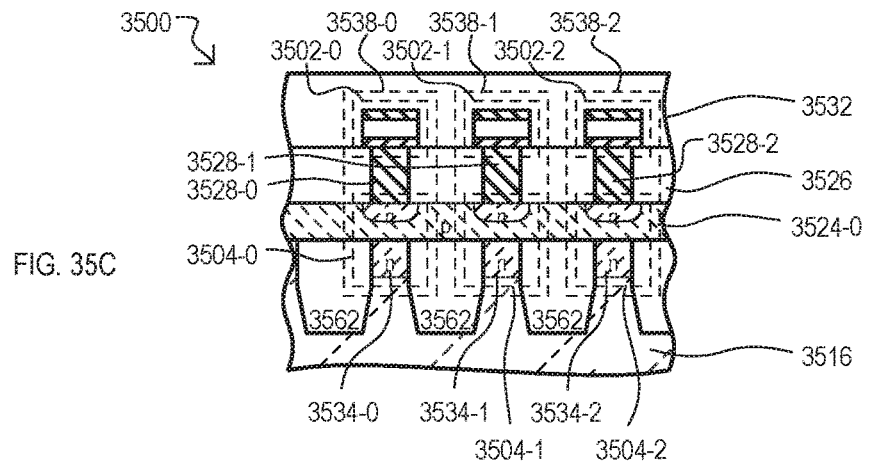

FIGS. 35A to 35C show a method of making a memory device according to another embodiment. FIGS. 35A to 35C also show npn access BJTs, so it is understood that alternate embodiments may also include pnp access BJTs by reversing the conductivity types of corresponding base, emitter and collector regions.

FIG. 35A shows the formation of substrate collector regions 3534-0-2 in a substrate 3516. In the example shown, a substrate 3516 may include isolation structures 3562. Photolithographic steps (or equivalent methods), may form a collector implant mask 3564. Ion implantation may implant n-type dopants to form substrate collector regions 3534-0-2 isolated from one another by isolation structures 3562.

FIG. 35B shows steps like that of FIG. 34C, and like items are referred to by the same reference character but with the first digits being "35" instead of "34". Further, actions like those described for FIGS. 34C to 34H, or equivalents, may be performed to arrive at a structure like that of FIG. 35C.

Figure 36A:
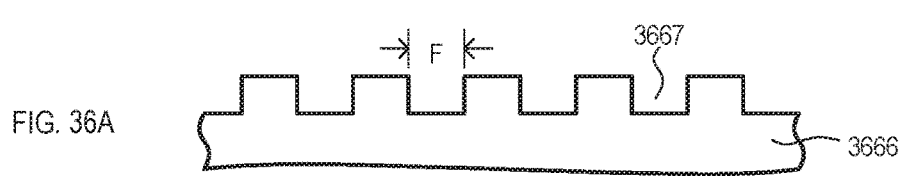
FIGS. 36A to 36C are a sequence of side cross sectional diagrams showing a method of forming sub-lithographic features that can be included in embodiments.
Figure 36B:
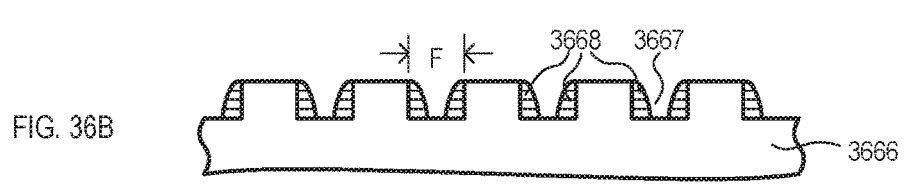
Figure 36C:
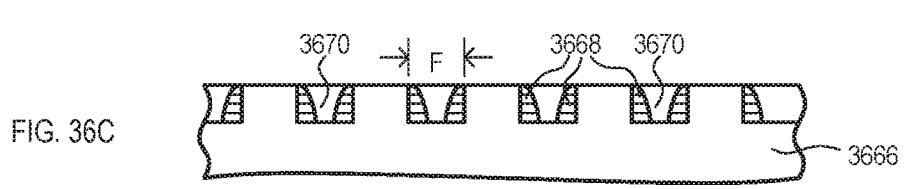

Referring now to FIGS. 36A to 36C, a method for forming lines having sub-lithographic features that may be included in the embodiments is shown in a sequence of side cross sectional views.

As noted above, cell areas smaller than $4F^2$ may be achievable by forming any lines (collector lines, base-emitter lines, base lines) with sub-lithographic dimensions. FIGS. 36A to 36C show but one way of achieving such line widths.

FIG. 36A shows the formation of an initial insulating film pattern 3666. Pattern 3666 may include trenches (one shown as 3667) formed therein having a feature size width "F". As but one example, an insulating film may be formed, and photolithography and etch techniques may be used to form trenches 3667.

FIG. 36B shows the formation of spacers (three shown as 3668). A spacer (e.g., 3668) may be formed on sides of trenches (e.g., 3667). A spacer (e.g., 3668) may be formed from a material having a high degree of etch selectivity with respect to initial pattern 3666 and a subsequently formed fill layer (not yet shown). As but one example, a spacer layer may be deposited over initial pattern 3666, and then anisotropically etched. A spacer (e.g., 3668) may be formed from one or more conductive and/or semiconductive materials. In one very particular example, spacers (e.g., 3668) may be formed from polysilicon.

FIG. 36C shows the formation of an insulating fill layer 3670 between spacers (e.g., 3668). As noted above, a fill layer 3670 may be selected to provide a high degree of etch selectivity for spacers (e.g., 3668). In one embodiment, a fill material may be deposited and then planarized to expose a top surface of spacers (e.g., 3668). Spacers (e.g., 3668) may form common collector lines, common base lines or common base-emitter lines, as described for embodiments shown herein, or equivalents.

While embodiments herein can include memory devices with volatile and non-volatile resistive portions, and memory devices utilizing with BJTs as access devices to programmable impedance elements, still other embodiments can include programmable impedance elements with a solid electrolyte containing one or more soluble metals having a relatively low, or no mobility within the electrolyte.

FIGS. 37A to 37C show a memory device structure 3717-0 in a series of side cross sectional views according to an embodiment. A structure 3717-0 may include a first electrode 3701, a second electrode 3703, and a dielectric 3709. A dielectric 3709 may include a solid electrolyte that may enable some materials to be oxidized and/or reduced in response to an applied voltage or current. In one embodiment, a dielectric 3709 may be a chalcogenide based solid ion conductor. In a very particular embodiment, a dielectric 3709 may include germanium disulfide ($GeS_2$).

FIG. 37A shows a structure 3717-0 prior to an oxidation step. A dielectric 3709 may include one or more substantially non-mobile oxidizable elements (two shown as 3719 and 3707. A substantially non-mobile oxidizable element may oxidize in response to an electric field, but have little or no mobility throughout the dielectric 3709. In one very particular embodiment, a dielectric 3709 may include $GeS_2$, and substantially non-mobile oxidizable elements may include tantalum (Ta), tungsten (W) or titanium (Ti). Such species may have limited mobility as compared to "fast" species, such as silver (Ag) and/or copper (Cu).

FIG. 37B shows a structure 3717-0 during an initial oxidation step. As shown, in response to a voltage (V+ to V−) applied across electrodes (3701 and 3703), elements 3719 and 3707 may oxidize from a non-ionic state to an ionic state. Species 3719 may remain in substantially the same place, while species 3707 may have substantially limited movement.

FIG. 37C shows a structure 3717-0 following an oxidation step. Substantially non-mobile oxidizable elements (e.g., 3719) may be oxidized (and thus have charge). Such a change in state may alter a capacitance of the structure as compared to such elements (e.g., 3719 and 3707) not being oxidized.

In some embodiments, a potential opposite to that shown in FIG. 37B may be applied across electrodes (3701 and 3703) to force a reduction operation, returning some or substantially all elements (e.g., 3719 and 3707) to the non-oxidized state.

In this way, a capacitance of a dielectric may be changed by oxidizing and/or reducing substantially non-mobile metallic species embedded in the dielectric.

FIGS. 38A to 38C show a memory device structure 3817-1 in a series of side cross sectional views according to another embodiment.

Referring to FIG. 38A, a structure 3817-1 may differ from that of FIGS. 37A to 37C in that a dielectric 3809 may include both substantially non-mobile oxidizable elements (one shown as 3819), as well as mobile oxidizable elements (one shown as 3811). A dielectric 3809 may take the forms of that described in for dielectric 3809 in FIGS. 37A to 37C. In one very particular embodiment, a dielectric 3809 may include $GeS_2$, substantially non-mobile oxidizable elements may include any of Ta, W or Ti, while mobile oxidizable elements may include any species such as Ag and/or copper Cu.

FIG. 38B shows a structure 3817-1 during an initial oxidation step. In response to a voltage (V+ to V−) applied across electrodes (3801 and 3803), elements 3819 and 3811 may oxidize from a non-ionic state to an ionic state. Species 3819 may remain in substantially the same place, while species 3811 may move a relatively large amount. FIG. 38B also shows how an electrode (in this embodiment 3801 may be a source of mobile oxidizable elements (one shown as 3813).

FIG. 38C shows a structure 3817-1 following a reduction step. Mobile oxidizable elements (e.g., 3811 and 3813) may attach (e.g., nucleate) to substantially non-mobile oxidizable elements (e.g., 3819). Such changes in state may alter a capacitance and/or a resistance of the structure 3817-1 as compared to the prior state shown in FIG. 37A.

As in the case of FIGS. 37A to 37C, in some embodiments, a potential opposite to that shown in FIG. 38B may be applied across electrodes (3801 and 3803) to force a reduction operation, returning some or substantially all elements (e.g., 3819, 3811 and 3813) to the non-oxidized state. Such a reduction operation may cause substantially mobile species to de-attach from substantially non-mobile species.

In this way, a capacitance of an ion conducting dielectric may be changed by oxidizing and/or reducing both mobile and non-mobile metallic species embedded in the dielectric.

Figure 39A:
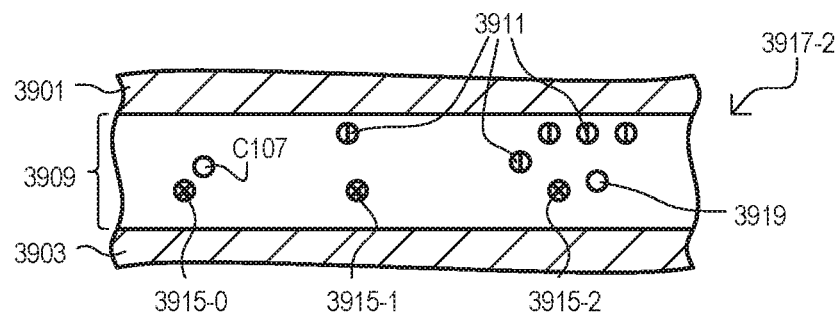
FIGS. 39A to 39C are side cross sectional views showing a programmable impedance structure and operation having substantially non-mobile and mobile oxidizable elements and non-oxidizable elements according to an embodiment.
Figure 39B:
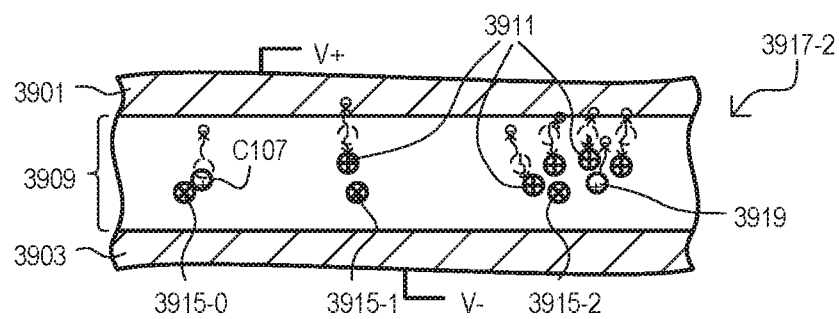
Figure 39C:
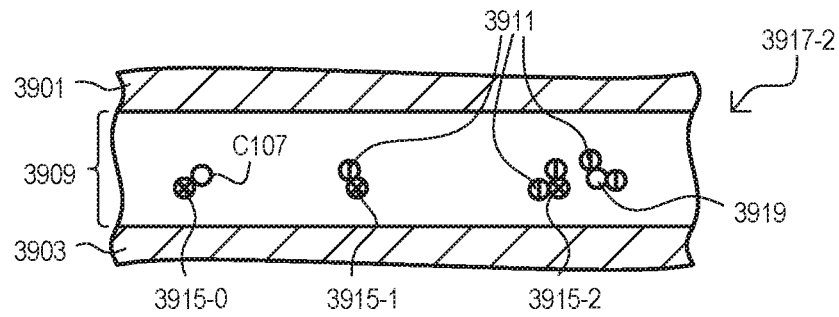

FIGS. 39A to 39C show a memory device structure 3917-2 in a series of side cross sectional views according to another embodiment.

Referring to FIG. 39A, a structure 3917-2 may differ from that of FIGS. 37A to 39C in that a dielectric 3909 may include substantially non-oxidizable elements (three shown as 3915-0 to 3915-2), as well as substantially non-mobile oxidizable elements (two shown as 3919 and 3907), as well as mobile oxidizable elements (three shown as 3911). A dielectric 3909 may take the forms of that described in for dielectric 3909 in FIGS. 37A to 38C. In one very particular embodiment, a dielectric 3909 may include $GeS_2$, a substantially non-oxidizable element may include gold (Au), a substantially non-mobile oxidizable elements may include nay of Ta, W or Ti, and mobile oxidizable elements may any of species such as Ag and/or copper Cu.

FIG. 39B shows a structure 3917-2 during an initial oxidation step. In response to a voltage (V+ to V−) applied across electrodes (3901 and 3903), elements 3919, 3907 and 3911 may oxidize from a non-ionic state to an ionic state. In contrast, substantially non-oxidizable elements (3915-0 to -2) may not be oxidized. Species 3919 may remain in substantially the same place, species 3907 may move a relatively small amount (or none at all), and species 3911 may start to move a relatively large amount.

FIG. 39C shows a structure 3917-2 following a reduction step. A low mobility element may attach to a close proximity substantially non-oxidizable species (e.g., 3907 attached to 3915-0). Further, mobile oxidizable elements may attach to non-oxidizable species (e.g., 3911 attached to 3915-1 and 3915-2). Still further, mobile oxidizable elements may attach to substantially non-mobile oxidizable species (e.g., 3911 attached to 3919). Such changes in state may alter a capacitance and/or resistance of the structure 3917-1 as compared to such elements (e.g., 3919, 3911 and 3913) being oxidized.

As in the case of FIGS. 37A to 38C, in some embodiments, a potential opposite to that shown in FIG. 39B may be applied across electrodes (3901 and 3903) to force a reduction operation, returning some or substantially all elements (e.g., 3919, 3911 and 3913) to the non-oxidized state. Such a reduction operation may cause substantially mobile species to de-attach from substantially non-mobile species, as well as non-oxidizable species.

In this way, a capacitance of an ion conducting dielectric may be changed by oxidizing and/or reducing both mobile and non-mobile metallic species embedded in the dielectric, to cause such species to attach to non-oxidizable species.

It is noted that the inclusion of low mobility, or non-mobile oxidizable elements in combination with mobile oxidizable elements, as shown in FIG. 38A to 39C, may result in stronger programmable resistance links than approaches having only mobile oxidizable elements.

FIGS. 40A to 40F shows a method of forming a storage element according to an embodiment in a series of side cross sectional views.

Figure 40A:
FIGS. 40A to 40F are side cross sectional views showing a method of forming a programmable impedance structure having substantially non-mobile species according to embodiments.

FIG. 40A shows forming a first electrode layer 4002. A first electrode layer 4002 may be a conductive layer. In one particular embodiment, a conductive layer 4002 may be a deposited layer. In the particular embodiment shown, first electrode layer 4002 may make contact with an access device (not shown). An access device may be a transistor, and in the embodiment shown, may be an insulated gate (e.g., MOS) field effect transistor.

Figure 40B:
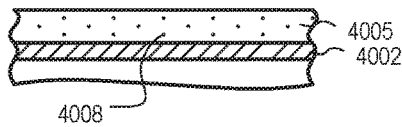

FIG. 40B shows the formation of a dielectric layer 4005. A dielectric layer 4005 may include a solid electrolyte layer with at least one soluble metal formed therein. A material (represented by "dots"—one shown as 4008) within solid electrolyte layer may be formed according to embodiments shown above. That is, a dielectric layer 4005 may include any of: substantially non-mobile oxidizable species alone, substantially non-mobile oxidizable species in combination with mobile oxidizable species, substantially non-oxidizable species in combination with mobile oxidizable species, substantially non-mobile oxidizable species in combination with substantially non-mobile oxidizable species, substantially non-oxidizable species in combination with substantially non-mobile and mobile oxidizable species.

In one embodiment, a dielectric layer 4005 may be deposited by sputtering with a target that contains the solid electrolyte and one or more metals. Alternatively, a solid electrolyte and soluble metal(s) may be deposited in separate layers, such as by sputtering with two different targets. A heat and/or light treatment step may then dissolve the soluble metal(s) into the solid electrolyte.

In one particular embodiment, a dielectric layer 4006 may include $GeS_2$ and the soluble metal(s) may include any of Ta, W, Ti or Au, as but a few examples.

Figure 40C:
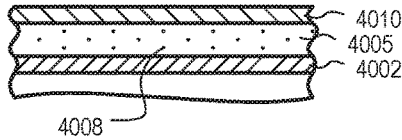

FIG. 40C shows the formation of a second electrode layer 4010. A second electrode layer 4010 may be a conductive layer, and in one particular embodiment, may be a deposited layer.

It is noted that either of first or second layers 4002 or 4010 may be an "active" electrode (i.e., anode), while the other may be an "indifferent" electrode (i.e., cathode). An active electrode may include the soluble metal, while the indifferent electrode may have substantially no soluble metal.

Figure 40D:
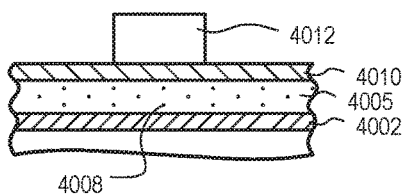

FIG. 40D shows the formation of an etch mask 4012 over a second electrode 4010. An etch mask 4012 may define separate memory elements for storing data.

Figure 40E:
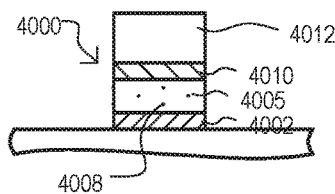

FIG. 40E shows an etching step that removes portions of layers 4002, 4005, 4010 not covered by an etch mask 4012 to thereby form a memory element 4000.

Figure 40F:
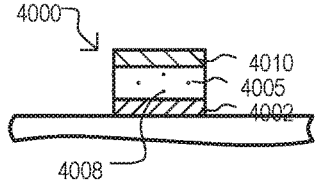

FIG. 40F shows a memory element 4000 following the removal of etch mask 4012.

A memory element like those shown herein, and equivalents, may be included in a memory cell as a data storage element. In some embodiments, such a memory element may be used as a capacitor element to store data values according an amount of charge stored (and/or lack of charge stored). In other embodiments, such a memory element may serve as a variable capacitor element. That is, a capacitance of the element may be varied to store different data values.

FIG. 41 shows memory element 4100 according to another embodiment. Memory element 4100 differs from that of FIG. 40F in that a memory cell 4100 may not be a completely planar structure. However, memory element 4100 may include a first electrode layer 4102, dielectric 4105, and second electrode layer 4110.

It is understood that FIGS. 40A to 41 are but two embodiments, and other embodiments may have layers with different shapes. As but a one example, some embodiments may have an electrode layer shared among multiple elements.

FIGS. 42A to 42D show program and erase operations according to embodiments as compared to systems having a "fast" soluble metal. In one arrangement, such operations may be for memory cells like those shown herein, and equivalents.

FIG. 42A is a diagram showing changes in resistance over time in response to the application of a programming voltage across electrodes of a memory element. Lines 4214-0 to 4214-$n$ show a range of possible responses in a resistance of a memory element during a programming operation. In contrast, line 4216 shows a response of a structure with a "fast" soluble metal (e.g., a $Ag/GeS_2$ system). As shown, there may be little or no resistance change in response to the same programming conditions that induce a substantial change in resistance in the fast soluble metal arrangement.

FIG. 42B is a diagram showing change in resistance over time in response to the application of an erase voltage across electrodes of a memory element. Lines 4214-0' to 4214-$n$' show a range of possible responses in a resistance of a memory element during an erase operation. Line 4216' shows a response of a structure with a "fast" soluble metal. As in the case of FIG. 42A, there may be little or no resistance change in response to the same erase conditions that induce a substantial change in resistance in the fast soluble metal arrangement.

FIG. 42C shows a resistance (R) and capacitance (C) response for a fast soluble metal system (e.g., $Ag/GeS_2$) in response to the application of a voltage over time. As shown, a resistance may make a substantial change from a higher resistance to a lower resistance. In contrast, a capacitance may make a substantial change from a lower capacitance to a higher capacitance.

FIG. 42D shows a resistance (R) and capacitance (C) response for a slow soluble metal system according to an embodiment in response to the application of a voltage over time. As shown, a resistance may make a smaller change than the response shown in FIG. 42C. However, a capacitance may make a substantial change from a lower capacitance to a higher capacitance.

Figure 43:
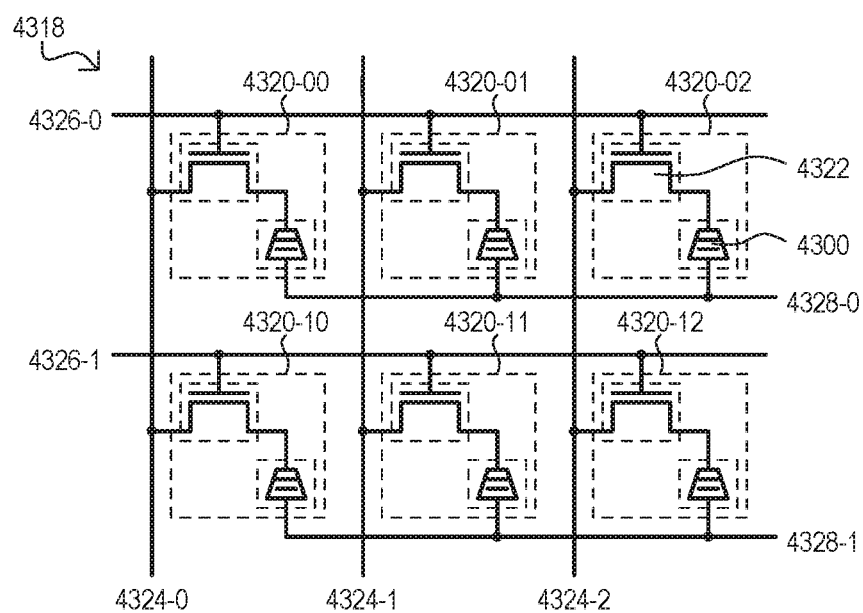
FIG. 43 is a schematic diagram of a memory device that includes programmable impedance structure having substantially non-mobile species according to an embodiment.

FIG. 43 shows a memory cell array 4318 according to one embodiment. A memory cell array 4318 may include memory cells 4320-00 to -12 arranged into rows and columns. Memory cells (4320-00 to -12) of a same column may be connected to a same bit line 4324-0 to -2, and memory cells of a same row may be connected to a same word line 4326-0 to -1.

Within each memory cell (4320-00 to -12), an access device (one shown as 4322) may provide a conductive path between a corresponding memory element (one shown as 4300) and a bit line (e.g., 4324-2) in response to a select signal on a corresponding word line (4326-0 to -1). In the very particular embodiment shown, an access device may be an n-channel transistor, however other embodiments may include other types of access devices. A memory element (e.g., 4300) may have one or more metals in a solid electrolyte, as described herein, and equivalents. A memory element (e.g., 4322) may serve as a capacitor to store data values. In FIG. 43, memory elements (e.g., 4322) may have cathodes connected to corresponding access devices (e.g., 4320) and anodes connected to a plate node (4328-0/1).

In one embodiment, a memory element (e.g., 4322) may represent different data values with different capacitances. In another embodiment, a memory element (e.g., 4322) may represent different data values with charge stored by the element. Still further, in other embodiments, a memory element (e.g., 4322) may store data with a combination of charge storage and capacitance changes (e.g., the act of charging such an element may increase its capacitance).

The embodiment of FIG. 43 shows a one-transistor memory cell array which may provide a compact memory device.

Figure 44:
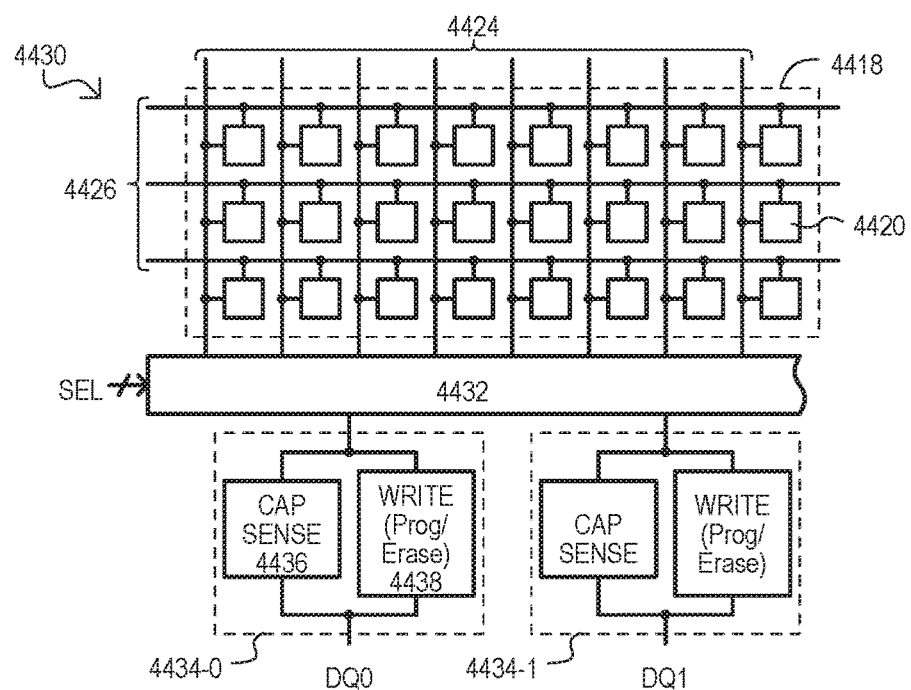
FIG. 44 is a schematic diagram of a memory device that includes programmable impedance structure having substantially non-mobile species according to another embodiment.

FIG. 44 shows a memory device 4430 according to another embodiment. A memory device 4430 may store values based on a capacitance change in memory elements. In the embodiment shown, a memory device 4430 may include a memory cell array 4418, a select circuit 4432, and data circuits 4434-0/1.

A memory cell array 4418 may have a structure like those described herein, or equivalents. A memory cell array 4418 may include memory cells (one shown as 4420) having one or more storage elements that include a dielectric as described in the embodiments herein, or equivalents. Memory cells (e.g., 4420) within memory array 4418 may be accessed by way of first access lines 4424 and second access lines 4426. In the particular embodiment shown, first access lines 4424 may be bit lines and second access lines 4426 may be word lines.

A select circuit 4432 may selectively connect data circuits 4434-0/1 to memory cells (e.g., 4420) via access lines 4424 based on selection values (SEL).

Data circuits 4434-0/1 may each include circuits to read data values from and write data to memory array 4418. In the embodiment shown, each data circuit 4434-0/1 may include a capacitance sense circuit (one shown as 4436) and a write circuit (one shown as 4438). A capacitance sense circuit (e.g., 4436) may sense a capacitance connected to an access line (4424). Accordingly, a capacitance sense circuit (e.g., 4436) may determine a data value stored in a memory cell when such a memory cell is connected to a bit line.

Write circuits (e.g., 4438) may apply voltages to a memory cell array 4418 that enable data values to be written into such cells. In very particular embodiments, write circuits (e.g., 4438) may apply voltages that cause oxidation/reduction reactions of a metal within a solid-state electrolyte of a memory element within one or more memory cells (e.g., 4420). Consequently, a capacitance of such a memory value may be set to one of a number of different values. It is noted that write circuits (e.g., 4438) may write data values to selected memory cells, or may write data values to all memory cells of a group (e.g., block erase or block program).

Figure 45:
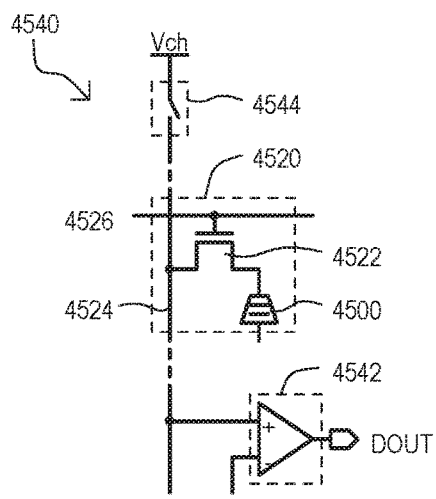
FIG. 45 is a schematic diagram of a sensing arrangement that may be used in embodiments.

FIG. 45 shows one very particular example of a sensing arrangement 4540 that may be used in an embodiment like that of FIG. 44. A sensing arrangement 4540 of FIG. 45 shows a charge switch 4544, a memory cell 4520 and a sense amplifier 4542.

Sensing arrangement 4540 shows one example of how a memory cell capacitance may be sensed by charging and then discharging a memory cell capacitance. A charge switch 4544 may charge (or discharge) a memory element 4500 to a voltage Vch through an access device 4522. Depending upon a capacitance of a memory element 4500, its charge/discharge rate may vary. A sense amplifier 4542 may compare a voltage on a bit line 4524 resulting from a charging (or discharging) of memory element to one or more reference voltages to thereby determine a data value (DOUT) stored by memory element 4500.

Figure 46A:
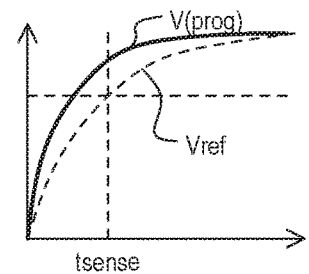
FIGS. 46A and 46B are graphs showing voltage responses of memory cells having programmable impedance structure with substantially non-mobile species according to another embodiment.
Figure 46B:
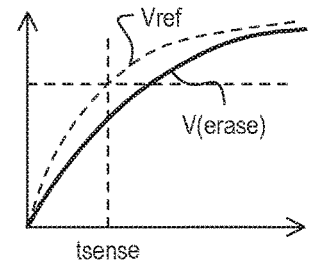

FIGS. 46A and 46B show very particular examples different voltage responses for different capacitances of a memory cell.

FIG. 46A shows an example of a voltage response (V(prog)) for a memory element having a higher capacitance as compared to a reference voltage (Vref). As shown, at a time tsense, a differential (positive with respect to Vref) may exist between the sensed voltage and the reference voltage. Such a difference may be amplified to generate a data output value. Such an amplification step may include a sample and hold step.

FIG. 46B shows an example of a voltage response (V(erase)) for a memory element having a lower capacitance as compared to a reference voltage (Vref). As shown, at a time tsense, a differential (negative with respect to Vref) may exist between the sensed voltage and the reference voltage. This difference may also be amplified to generate a data output value as noted for FIG. 46A.

FIGS. 46A and 46B show but one example of capacitance sensing techniques that may be included in the embodiments.

It is understood that FIGS. 46A and 46B show but one possible way of sensing a variable capacitance memory element. Alternate embodiments may employ other know capacitance sensing techniques.

Figure 47:
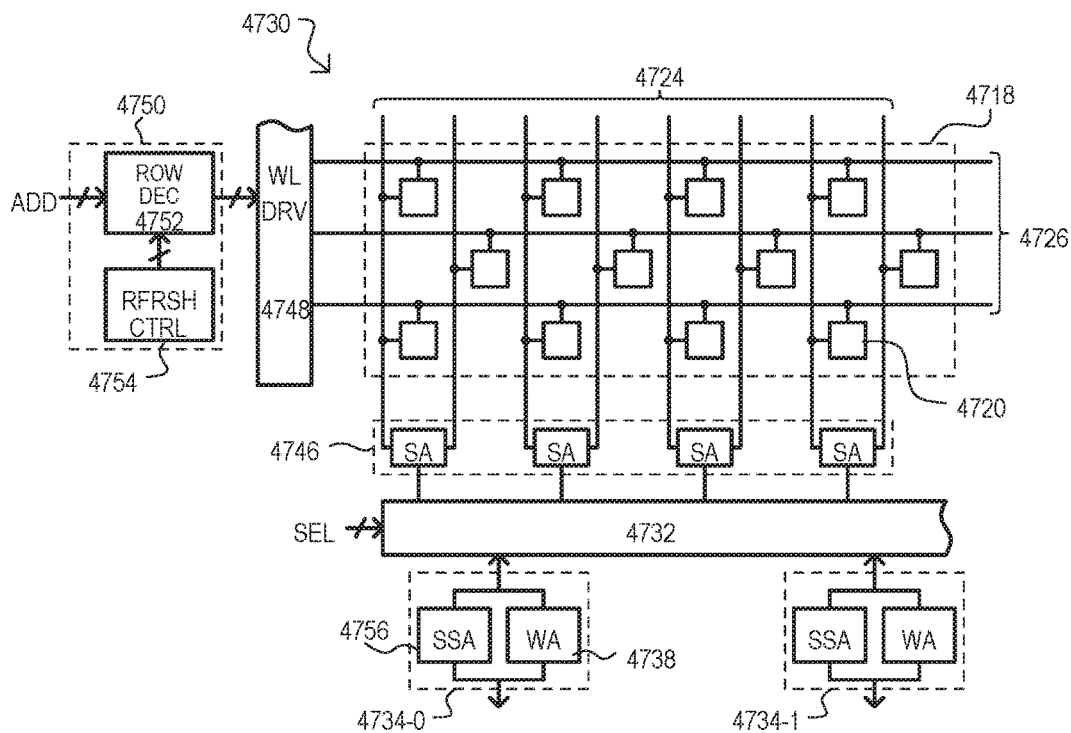
FIG. 47 is a block schematic diagram of a memory device having memory cells with substantially non-mobile species according to another embodiment.

FIG. 47 shows a memory device 4730 according to another embodiment. A memory device 4730 may store values based on charge stored by capacitive memory elements. In the embodiment shown, a memory device 4730 may include a memory cell array 4718, a select circuit 4732, data circuits 4734-0/1, sense refresh circuits 4746, a row driver circuit 4748, and a refresh address circuit 4750.

A memory cell array 4718 may have a structure like those described herein, or equivalents. As in the case of FIG. 44, a memory cell array 4718 may include memory cells (one shown as 4720) having one or more storage elements as described for other embodiments herein. Such a material may serve as all, or a portion of a capacitor dielectric for a storage capacitor. Further, memory cells (e.g., 4720) within memory cell array 4718 may be accessed by way of first access lines 4724 and second access lines 4726. In the particular embodiment shown, first access lines 4724 may be bit lines and second access lines 4726 may be word lines.

A select circuit 4732 may selectively connect data circuits 4734-0/1 to memory cells (e.g., 4720) via access lines 4724 based on selection values (SEL).

Sense refresh circuits 4746 may sense data values on bit lines 4724 (in this case, bit line pairs) and amplify such values to rewrite them back into accessed cells, thereby refreshing the data values stored therein. Sense refresh circuits 4746 may include any of the following: a reference voltage circuit for applying a reference voltage to both bit lines prior to a refresh or read operation; or an equalization circuit that may short bit lines together prior to a refresh or read operation.

It is noted that sense refresh circuits 4746 are shown in a "folded" bit line arrangement, in which one bit line from an array is connected to a memory cell while the other bit line of the array is connected to a "dummy" bit line from the same array. However, alternate embodiments may include "open" bit line sensing arrangements (selected bit line and dummy bit line from separate arrays) and/or single ended sensing schemes (selected bit line as one input to sense amplifier, a reference voltage source as another).

A row driver circuit 4748 may select a row of memory cells, to thereby provide data for read, refresh and/or write data to such memory cells. In the very particular examples shown, row driver circuit 4748 may drive word lines 4726 in response to an output from refresh address circuit 4750. A refresh address circuit 4750 may include a row decoder 4752 and a refresh control 4754. A row decoder 4752 may generate word line select signals for row driver circuit 4748 that may determine which word line is driven to a select voltage. In the embodiment shown, a row decoder 4752 may operate in response to a received address value ADD for read and write operations, and may also sequence through rows according to refresh control 4754. Refresh control 4745 may ensure that data values are refreshed in memory cells of array 4718 within some predetermined minimum data retention time. In an alternate embodiment, refresh operations may be controlled by an externally applied address.

Data circuits 4734-0/1 may each include circuits for writing data to memory array 4718. Write circuits (e.g., 4738) may write predetermined voltages to store (or not store) charge on capacitive storage elements within memory cells. In addition, in the embodiment shown, each data circuit 4734-0/1 may include a secondary sense amplifier 4756. Secondary sense amplifiers (e.g., 4756) may provide additional signal amplification over that from sense/refresh circuits 4746 in a read operation.

FIGS. 48A to 48E show the writing of data values to memory cells according to particular embodiments. FIGS. 48A to 48E show a memory cell 4820 having a configuration like those shown in FIG. 43, however, an access device 4822 may be connected to an anode of each element 4800. Other embodiments may have different configurations. It is understood that a memory element 4800 within each memory cell 4820 may be a capacitor having a dielectric formed by a solid electrolyte as described herein or equivalents.

FIGS. 48A and 48B show one way of writing data to a memory cell 4820 according to an embodiment in which a capacitive element is charged. FIG. 48A shows a writing of a first data value. An access device 4822 may be enabled (e.g., placed into a low impedance state) and a memory element 4800 may be charged by applying a relatively high voltage (Vwrite_1) to a bit line 4824, and a relatively low voltage (VLO) to cathode.

FIG. 48B shows a writing of a second data value. An access device 4822 may be enabled and a memory element 4800 may be discharged by applying a relatively low voltage (VLO) to both a bit line 4824 and to the cathode. In some embodiments, the solid state electrolyte dielectric material may have a higher dielectric constant than conventional capacitor structures that may include silicon dioxide as a dielectric material. Consequently, a storage cell may accommodate greater charge per unit area, and/or allow a storage cell to be scaled down, yet retain a same amount of charge as a larger conventional dielectric structure.

FIGS. 48C to 48E show another way of writing data to a memory cell 4820 according to an embodiment. In this example, a memory element may both be charged and have its capacitance altered. FIG. 48C shows a memory cell 4820 prior to a data write operation. A memory element 4800 may have a capacitance that may be any of multiple values (C?) depending upon whether data has been written into the memory cell, and if so, which data value.

FIG. 48D shows a writing of a first data value. An access device 4822 may be enabled and a memory element 4800 may be charged by applying a relatively high voltage (VHI) to a bit line 4824, and applying a lower voltage (Vref) to cathode. Such a write operation may alter a capacitance of memory element 4800 raising it to a higher level (C_HI) (if the element capacitance was not already at such a higher level).

FIG. 48E shows a writing of a second data value. An access device 4822 may be enabled and a memory element 4800 may be charged to an opposite polarity by applying a relatively low voltage (VLO) to a bit line 4824, and applying relatively higher voltage (Vref) to the cathode. Such a write operation may alter a capacitance of memory element 4800 lowering it to a lower level (C_LO) (if the element capacitance was not already at such a lower level).

In this way, a memory cell and/or device may store data value with a capacitive element having a solid state electrolyte as a dielectric by either charging such an element, altering the capacitance of such an element, or a combination of both.

FIGS. 49A and 49B show very particular examples how data values may be sensed in a charge storage configuration. FIGS. 49A and 49B include a response for a sensed bit line 4958 (i.e., a bit line accessing a memory cell for a read operation), as well as a response of a dummy bit line 4960 (i.e., a bit line isolated from memory cells).

FIG. 49A shows a response from reading a first data value. Prior to time t0, a bit line and its corresponding dummy bit line may be at a reference voltage Vref, by operation of a reference voltage circuit, equalization circuit, or both. At about time t0, a bit line may be connected to a memory cell. In the response shown it is assumed that the memory cell has a charged capacitor. Consequently a bit line response 4958 may split high from the dummy response 4960. At about time t1, a sense amplifier may amplify a differential voltage, driving a bit line and dummy bit line to opposite logic potential.

FIG. 49B shows a response from reading a second data value. Prior to time t0, a bit line and its corresponding dummy bit line may have the same state as that of FIG. 49A. At about time t0, a bit line may be connected to a memory cell. In this case, it is assumed that the memory cell has a discharged capacitor. Consequently a dummy line response 1060 may split high from the bit line response 1060. At about time t1, a sense amplifier may amplify a differential voltage, driving a bit line and dummy bit line to levels opposite of those shown in FIG. 49A.

A memory device and method according to the embodiments may be included in a standalone memory device (i.e., a memory device providing substantially only storage functions). In alternate embodiments, such a memory device may be embedded into larger integrated circuit device.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
by operation of a controller circuit, writing data into a volatile memory portion formed in an integrated circuit substrate of a memory device;
in response to first conditions, writing the data from the volatile memory portion into a nonvolatile memory portion formed in the same integrated circuit substrate as the volatile memory portion; and
the nonvolatile memory portion stores the data in two terminal memory elements re-programmable between at least two different resistance states.

2. The method of claim 1, further including:
by operation of the controller circuit, reading the data from the volatile memory portion.

3. The method of claim 1, wherein:
the first conditions include receiving predetermined control values for the integrated circuit.

4. The method of claim 1, wherein:
the first conditions include detecting a low power condition by operation of a power supply monitoring circuit.

5. The method of claim 4, further including:
providing power to memory device with a back-up power supply in response to detecting the low power condition.

6. The method of claim 1, further including:
in response to second conditions, reading the data from the nonvolatile memory portion into the volatile memory portion.

7. The method of claim 6, wherein:
the second conditions include a power-on or reset of the memory device.

8. The method of claim 1, wherein:
the controller circuit is formed on the same integrated circuit substrate as the volatile and nonvolatile memory portions.

9. The method of claim 1, wherein:
the controller circuit is not formed on the same integrated circuit substrate as the volatile and nonvolatile memory portions.

10. A method, comprising:
in response to first conditions, writing first data from a nonvolatile memory portion of a memory device into a volatile memory portion of the same memory device; and
by operation of a memory controller circuit, reading the first data from the volatile memory portion onto an output memory bus of the memory device; wherein
the volatile and non-volatile memory portions are formed in a same integrated circuit substrate, and
the nonvolatile memory portion stores data in two terminal memory elements re-programmable between at least two different resistance states.

11. The method of claim 10, wherein:
the first conditions include receiving predetermined control values for the integrated circuit.

12. The method of claim 11, wherein:
the first conditions include a power-on or reset of the memory device.

13. The method of claim 10, further including:
in response to second conditions, writing second data from the volatile memory portion into the nonvolatile memory portion.

14. The method of claim 13, wherein:
the second conditions include detecting a low power condition by operation of a power supply monitoring circuit.

15. The method of claim 14, further including:
providing power to memory device with a back-up power supply in response to detecting the low power condition.

16. A method, comprising:
storing data in
nonvolatile memory cells of a nonvolatile memory cell array of an integrated circuit device, or
volatile memory cells of a volatile memory cell array of the integrated circuit device;
in response to first conditions, by operation of a controller circuit, transferring the data between the volatile memory cells of the volatile memory cell array and the nonvolatile memory cells of the nonvolatile memory array; wherein
each nonvolatile memory cell stores at least one bit value in at least one two terminal memory element that is re-programmable between at least two different resistance states.

17. The method of claim 16, wherein:
the first conditions are selected from the group of: receiving predetermined control values for the integrated circuit device, detecting a low power condition by operation of a power supply monitoring circuit, and a power-on or reset of the integrated circuit device.

18. The method of claim 16, wherein:
storing data in the nonvolatile memory cells includes storing data in two terminal nonvolatile memory elements that each include a dielectric layer formed between two electrodes; wherein
the dielectric layer is programmed to one resistance value to store one data value, and programmed to another resistance value to store another data value by application of electric fields which induce an oxidation-reduction operation within the dielectric layer.

19. The method of claim 16, wherein:
the nonvolatile memory cells each include
at least one access transistor formed in a substrate of the integrated circuit device, and
at least one nonvolatile memory element formed above the substrate.

20. The method of claim 16, wherein:
the nonvolatile memory cell array includes nonvolatile memory cells with at least one nonvolatile memory cell access transistor;
the volatile memory cell array includes volatile memory cells with at least one volatile memory cell access transistor; and
a minimum transistor size of the nonvolatile memory cell access transistors is different than a minimum transistor size of the volatile memory cell access transistors.

* * * * *